United States Patent [19]

Campbell et al.

[11] Patent Number: 5,421,891
[45] Date of Patent: Jun. 6, 1995

[54] HIGH DENSITY PLASMA DEPOSITION AND ETCHING APPARATUS

[75] Inventors: Gregor A. Campbell, Glendale; Robert W. Conn, Los Angeles; Dan Katz, Beverly Hills; N. William Parker, Fairfield; David I. C. Pearson, Los Angeles, all of Calif.

[73] Assignee: Plasma & Materials Technologies, Inc., Chatsworth, Calif.

[21] Appl. No.: 964,149

[22] Filed: Oct. 19, 1992

Related U.S. Application Data

[63] Continuation-in-part of Ser. No. 887,278, May 21, 1992, abandoned, which is a continuation of Ser. No. 650,788, Feb. 4, 1991, Pat. No. 5,122,251, which is a continuation-in-part of Ser. No. 365,533, Jun. 13, 1989, Pat. No. 4,990,229.

[51] Int. Cl.$^6$ .......................................... C23C 16/50
[52] U.S. Cl. ..................... 118/723 R; 118/723 AN; 156/345; 204/298.37
[58] Field of Search ............... 118/723 MR, 723 MA, 118/723 AN, 719; 156/345; 204/298.37, 298.38

[56] References Cited

U.S. PATENT DOCUMENTS

| | | | |
|---|---|---|---|
| 4,101,411 | 7/1978 | Suzuki et al. | 204/298 |
| 4,368,092 | 1/1983 | Steinberg | 156/345 |
| 4,401,054 | 8/1983 | Matsuo et al. | 118/723 |
| 4,421,898 | 12/1983 | Lundberg | 525/186 |
| 4,433,228 | 2/1984 | Nishimatsu | 219/10.55 R |
| 4,557,819 | 12/1985 | Meacham et al. | 204/298 |
| 4,610,748 | 9/1986 | Engle et al. | 156/345 |
| 4,626,312 | 12/1986 | Tracy | 156/345 |
| 4,668,338 | 5/1987 | Maydan et al. | 156/643 |
| 4,668,365 | 5/1987 | Foster et al. | 204/192.23 |
| 4,810,935 | 5/1989 | Boswell | 315/111.41 |
| 4,844,775 | 7/1989 | Keeble | 156/643 |
| 4,859,908 | 8/1989 | Yoshida et al. | 315/111.81 |
| 4,876,983 | 10/1989 | Fukuda et al. | 118/722 |
| 4,918,031 | 4/1990 | Flamm et al. | 437/225 |
| 4,948,458 | 8/1990 | Ogle | 156/643 |
| 4,948,750 | 8/1990 | Kausche et al. | 437/101 |
| 4,963,242 | 10/1990 | Sato et al. | 204/298.31 |
| 4,990,229 | 2/1991 | Campbell et al. | 204/298.06 |
| 5,032,202 | 7/1991 | Tsai et al. | 156/345 |
| 5,089,441 | 2/1992 | Moslehi | 437/225 |
| 5,091,049 | 2/1992 | Campbell et al. | 156/643 |
| 5,122,251 | 6/1992 | Campbell et al. | 204/298.06 |

FOREIGN PATENT DOCUMENTS 62-30891  2/1987  Japan.
63-77120  4/1988  Japan.
63-274148 11/1988  Japan.

OTHER PUBLICATIONS

Keizo Suzuki et al., "Microwave plasma etching," Vacuum, vol. 34, No. 10/11 (1984), pp. 953-957.
Boswell, "Plasma Production Using A Standing Helicon Wave," Physics Letters, vol. 33A (1970), pp. 457-458.
Montgomery et al., "Effects of Uniform Rotation on Helically-deformed, Resistive, Magnetohydrodynamic Equilibria," Plasma Physics and Controlled Fusion, vol. 33, No. 14 (1991), pp. 1871-1875.
Limpaecher et al., "Magnetic Multipole Containment of Large Uniform Collisionless Quiescent Plasmas," Rev. Sci. Instrum., vol. 44, No. 6 (1973), pp. 726-731.

Primary Examiner—R. Bruce Breneman
Assistant Examiner—Jonathan D. Baskin
Attorney, Agent, or Firm—Skjerven, Morrill, MacPherson, Franklin & Friel; Alan H. MacPherson; David T. Millers

[57] ABSTRACT

Plasma deposition or etching apparatus is provided which comprises a plasma source located above and in axial relationship to a substrate process chamber. Surrounding the plasma source are an inner magnetic coil and an outer magnetic coil arranged in the same plane perpendicular to the axis of the plasma source and the substrate process chamber. Preferably, a first current is provided through the inner coil and a second current in a direction opposite to the direction of the first current is provided through the outer coil. The result is to advantageously shape the magnetic field in the process chamber to achieve extremely uniform processing, particularly when a unique diamond shaped pattern of gas feed lines is used wherein the diamond is arranged to be approximately tangent at four places to the outer circumference of the workpiece being processed in the apparatus.

17 Claims, 21 Drawing Sheets

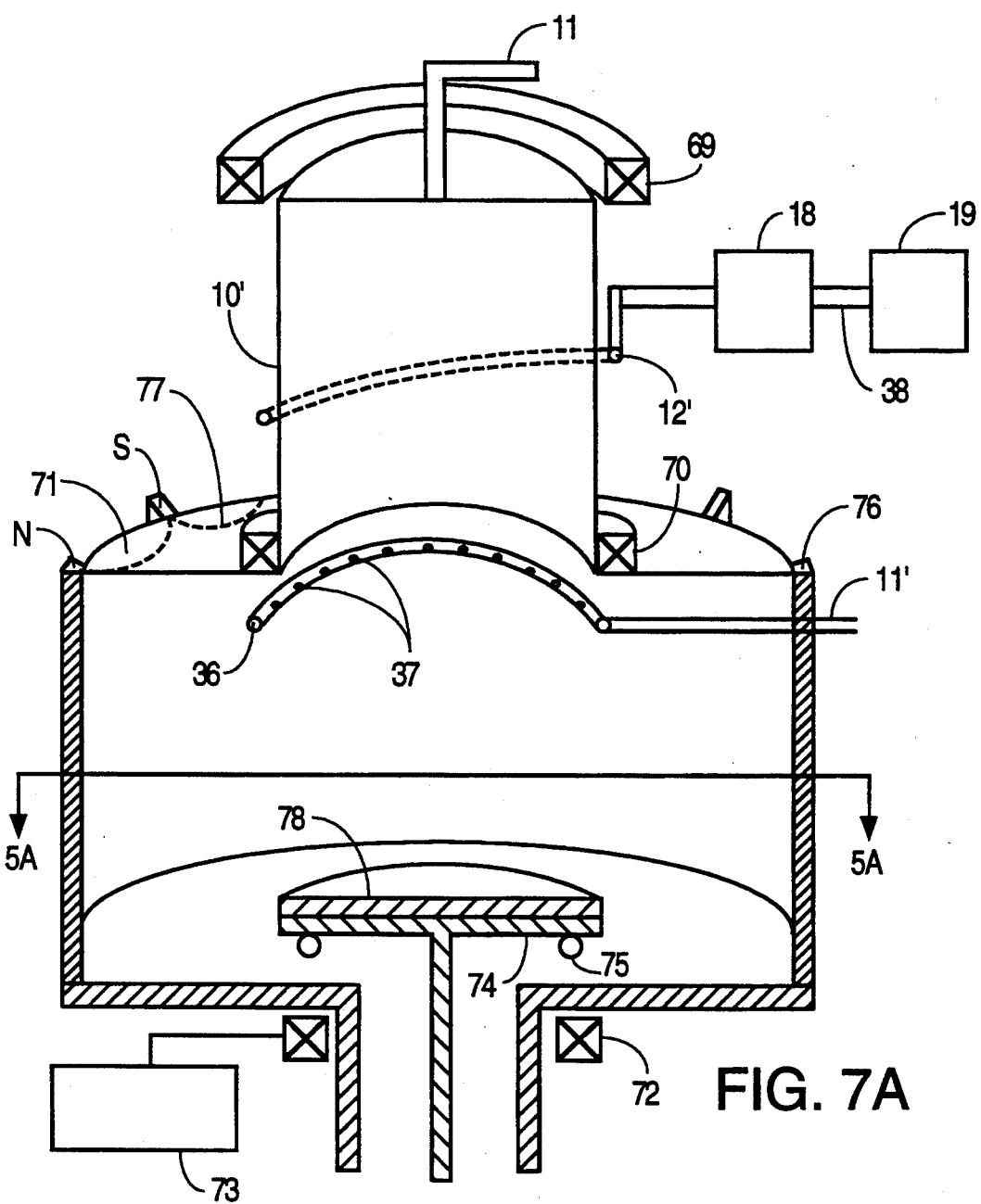
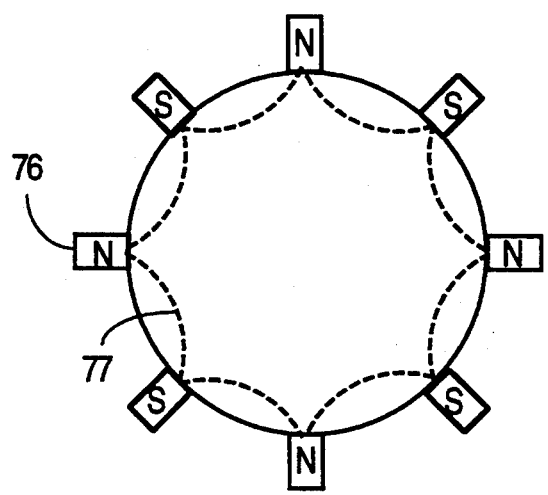
FIG. 7A
FIG. 7B

HIGH DENSITY PLASMA DEPOSITION AND ETCHING APPARATUS

CROSS-REFERENCE TO RELATED APPLICATION

This application is a continuation-in-part of U.S. patent application Ser. No. 07/887,278, filed May 21, 1992, abandoned, which is a continuation of U.S. patent application Ser. No. 07/650,788, filed Feb. 4, 1991 and issued Jun. 16, 1992 as U.S. Pat. No. 5,122,251, which is a continuation-in-part of U.S. patent application Ser. No. 07/365,533, filed Jun. 13, 1989 and issued Feb. 5, 1991 as U.S. Pat. No. 4,990,229, all of which are hereby incorporated by reference.

BACKGROUND OF THE INVENTION

1. Field of the Invention

The present invention relates to a plasma deposition or etching method and various apparatus for depositing a thin film onto a substrate or for removal (etching) of a film from a substrate. The present invention includes the use of a new and significantly better high density plasma deposition and etching apparatus, a significantly improved magnetic means for the plasma source region and operation with a specified range of processes and gases. Applications of the present invention include the removal by etching of a layer from a surface, the removal by sputtering of a layer from a surface, or the deposition of a layer onto a surface.

2. Related Art

Etching

Plasma etching involves using chemically active atoms or energetic ions to remove material from a substrate. It is a key technology in the fabrication of semiconductor integrated circuits. However, before the advent of microwave plasmas utilizing electron cyclotron resonance (ECR), it was becoming difficult for conventional plasma etching techniques to satisfy the requirements dictated by the increase in device packing density. Specifically, the requirement for fine pattern etching without undercutting (anisotropic etching) and the requirements for low damage and high selectivity could hardly be satisfied at the same time.

Deposition

Plasma Enhanced Chemical Vapor Deposition (PECVD) is a widely used technique to deposit materials on substrates in a host of applications. In normal Chemical Vapor Deposition (CVD) the chemical reaction is driven by the temperature of the substrate and for most reactions this temperature is high ($>800°$ C.). The high substrate temperature needed precludes use of this method in a number of applications particularly in microelectronics, displays and optical coatings. The role of the plasma is to dissociate and activate the chemical gas so that the substrate temperature can be reduced. The rate of dissociation, activation and ionization is proportional to the density of the plasma. It is therefore of importance to make the plasma as dense as possible.

Sputtering

Sputtering is also a widely used method for depositing materials onto substrates for a wide variety of applications such as the production of hard or decorative coatings and the coating of glass. In general, a plasma is produced at the sputter target material and the sputter target is biased to a negative voltage of around 700 V. Plasma ions (generally argon) impact the surface and sputter the material which then transports as neutral atoms to a substrate. Reactive gases can be introduced to chemically react with the sputtered atoms at the host substrate in a process called reactive sputter deposition. Rate is often important and it is therefore important to make the plasma as dense as possible. Ionization of reactive gases is also important and is helped by having plasma in the vicinity of the substrate material. Sputtering is also done by ions accelerated in an ion or plasma gun and then made to bombard the sputter target. In this case, a bias voltage on the target is not necessary. For sputtering insulating materials, RF voltage bias can applied to the sputter target.

Existing Methods

There are presently two widely used methods for plasma deposition and etching, the parallel plate reactor and the ECR plasma deposition system. There are also methods based on the use of RF to produce plasma including ordinary induction techniques and techniques based on whistler waves.

Parallel Plate Reactor (Diode)

The RF diode has been widely used for both deposition and etching. It is described in detail in the book by Chapman ("Glow Discharge Processes" John Wiley & Sons 1980). It uses RF at 13.56 MHz capacitively coupled to one electrode while the other electrode is grounded. The pressure in the system is typically 1 mtorr to 1 torr and the plasma density is typically $10^{10}$ electrons per $cm^3$. The rate at which both deposition or etching occurs is dependent on the density of the plasma and the density (pressure) of the reactive gas used to etch, or, in CVD processes, to deposit.

In etching, the high pressure needed to sustain the discharge causes collisions between the ions and the background gas. This causes the paths of the etching ions or atoms to be randomized or non-directional, leading to undercutting of the mask. This is referred to as an isotropic etch. It is desirable to have the etch atoms or ions be directional so that straight anisotropic etches can be achieved. At the high pressure used in RF diode discharges, it is necessary for the ions to have high energy (up to 1 KeV) to achieve an anisotropic etch. However, the high energy of the ions can cause damage to the substrate, film materials or photoresist.

The plasma is sustained by secondary electrons that are emitted by ions impacting the cathode. These electrons are accelerated by the voltage drop across the sheath which is typically 400–1000 V. These fast electrons can bombard the substrate causing it to have a high voltage sheath drop. This high voltage can accelerate the ions leading to damage of the substrate or film material. The presence of high energy electrons leading to high voltage sheath drops is undesirable.

Electron Cyclotron Resonance Plasmas

The advent of using microwaves at 2.45 GHz and a magnetic field of 875 Gauss to utilize electron cyclotron resonance allowed the generation of high density plasmas at low pressure. The advantages of this technique for plasma etching are described by Suzuki in U.S. Pat. No. 4,101,411 and in an article entitled "Microwave Plasma Etching" published in Vacuum, Vol. 34, No. 10/11, 1984. Due to a low gas pressure (0.04–0.4 Pa) and high plasma density (1.7–7×10¹¹ electrons/c³) anisotropic etch with high etch rates is achievable.

Suzuki, in U.S. Pat. No. 4,101,411, describes a plasma etching apparatus using ECR. Natsuo, in U.S. Pat. No. 4,401,054 describes a plasma deposition apparatus utilizing ECR. In U.S. Pat. No. 4,876,983 there is described a plasma etching apparatus to improve uniformity and have the specimen close to the source chamber.

While this technique is desirable over the parallel plate reactor in many respects, it has several limitations. The magnetic field needed is very high (1–2 kGauss) which means that heavy, power consuming electromagnets must be used. The maximum density is limited by either cut-off in certain configurations or by refraction in other configurations to the value of $1 \times 10^{12}$ electrons/cm³ in the source. The expense of the power supply and necessary hardware to generate and transmit the microwaves is high. The uniformity (or width of the plasma profile) is not very good.

RF Helicon Whistler Wave Plasmas

The first use of helicon type whistler waves to generate dense plasmas was described in 1970 by Boswell in the journal, Physics Letters, Vol. 33A, pp 457–458 (1970) which showed an antenna configuration used by Ovchinnikov. This type of antenna excites an m=1 mode. The frequency of excitation was 8 MHz. The density profile of the 10 cm plasma was found to be quite peaked, particularly at the higher magnetic field strengths needed for high densities. In Boswell, U.S. Pat. No. 4,810,935, two mathematical relationships are required to be satisfied. These equations are in fact overly restrictive and not applicable to the approach outlined by Campbell, Conn and Shoji in U.S. Pat. Nos. 4,990,229 and 5,122,251.

In these publications the mechanism for efficient coupling of the RF energy to the plasma could not be explained. Chen, in an Australian National university report, explained the mechanism as Landau damping.

Chen, in a paper presented in August 1988 and published in the journal, Plasma Physics and Controlled Fusion, Vol. 33, 1991, describes a system using whistler waves to generate dense plasmas for use in advanced accelerators. The type of antenna used in this arrangement was similar to that used by Boswell in that it excited the m=1 mode and was a type known as the Nagoya Type III antenna. This type of antenna is explained in a paper by Watari (1978). The frequency of excitation was 30 MHz.

Campbell, Conn and Shoji, in U.S. Pat. Nos. 4,990,229 and 5,122,251 describe new and highly efficient antenna means designed to excite the m=0 and the m=1 modes, and to control the wave number of the excited wave. This is important in obtaining the maximum plasma density, in generating the broadest spatial plasma density profile in the source and process chamber regions, and in providing control over the electron temperature in the plasma.

Efficiency of plasma production by low frequency whistler waves depends on the coupling of RF energy into the plasma. As discussed by Campbell et al. in U.S. Pat. No. 4,990,229, an important mechanism for damping of the RF energy is Landau damping. The phase velocity of the whistler wave is given by $\omega/k_z$, where $k_z$ is given by the dispersion relation and depends on the plasma density and vacuum magnetic field strength. Ideally, the phase velocity of the wave should be near the maximum of the ionization potential of the gas we wish to ionize. From the dispersion relation for the m=0 mode, the higher the value of $k_z$, the higher the density. However, the phase velocity of the wave is $\omega/k_z$ and so increasing $k_z$ decreases the energy of the electrons that are accelerated by the wave. If the $k_z$ is too high then the energy of the electrons may fall below the ionization potential.

Also, Campbell, Conn and Shoji in the above-mentioned patents use a magnetic bucket means in conjunction with the plasma generator to provide a uniform plasma density over large circular or rectangular areas. They use one or multiple plasma generators in conjunction with cylindrical or rectangular magnetic buckets to provide a uniform density over a large area for the coating or etching of substrates such as are needed for IC or flat panel display processing. They use expansion of the magnetic field to allow deposition or etching over a large area.

Other RF Induction Sources

Other existing methods use RF circuit resonances to generate plasma. These methods are less efficient than those using low frequency whistler waves, and do not generate high density plasmas. Ogle, in U.S. Pat. No. 4,948,458 describes an RF means to produce planar plasma in a low pressure process gas using an external planar spiral coil (or series of concentric rings) and connected to a second loop which is positioned to allow for effective coupling of the circuit and for loading of the circuit at the frequency of operation. Steinberg et al., in U.S. Pat. No. 4,368,092, describes a plasma generating system employing a helical inductive resonator for producing the plasma external to an etching chamber. The plasma is non-uniform and passes through a tube before utilization. U.S. Pat. No. 4,421,898, describes an inductively-coupled plasma generating apparatus, where a transformer having a magnetic core induces electron circulation in an insulating tube carrying a process gas. Gas ionization is non-uniform, and exposure to the wafer occurs downstream. U.S. Pat. No. 4,626,312, describes a conventional parallel plate plasma etcher where the wafer is situated on a lower electrode and a plasma is generated by applying radiofrequency energy across the lower electrode and a parallel upper electrode. U.S. Pat. Nos. 4,668,338 and 4,668,365, describe magnetically-enhanced plasma processes for reactive ion etching and chemical vapor deposition, respectively. Flamm et al. in U.S. Pat. No. 4,918,031 describes an L-C circuit referred to as a helical resonator which consists of an inner helically shaped copper coil surrounding a quartz tube and attached at one end to a cylindrical copper shield. The opposite end of the inner coil is unterminated. No external magnetic field is employed in these approaches and all generate plasmas at low pressure in the 1–10 mtorr range but at moderate density on the order of 10 cm³ in the quartz source tube or just below a planar spiral coil and without a high degree of spatial uniformity. No externally generated magnetic field is employed in these RF plasma generators.

SUMMARY OF THE INVENTION

The present invention utilizes low frequency RF whistler waves to generate plasmas of high density for use in plasma etching, deposition, and sputtering equipment. In conjunction with a source tube into which a gas is injected and along the central axis of which a magnetic field is established, a single loop antenna is disposed in a plane transverse to the central axis. The angle of the antenna plane is 90° if it is desired to excite only M=0 mode, or at less than 90° if it is desired to excite components in both M=0 and M=1 mode. The gas is a noble or reactive gas at a pressure of 0.1 mtorr to 200 mtorr. The magnetic field strength is in the range of 10 to 1000 gauss and the antenna is driven with RF energy of 100 W to 5 KW at a frequency range of 2 MHz to 50 MHz. With the antenna placed along the tube source at a sufficient distance along the axis from the gas injection end, the other end defining an open egress zone leading to a process chamber, the single loop antenna surprisingly provides highly efficient wave coupling to establish a high density and high current plasma.

In accordance with other features of the invention, the plasma generated by this plasma source is supplied to a process chamber including a magnetic bucket system for holding the plasma away from the process chamber walls. The arrangement provides, in combination, a uniform plasma density over a large circular area, so that a large substrate may be etched or otherwise processed. Another feature is that a magnetic cusp zone may be established, at the material surface being processed, to homogenize and make more uniform the plasma at that location. An aspect of this is that the magnetic cusp position relative to the substrate may be time modulated to enhance uniformity and reduce sensitivity to substrate location.

Further, the magnetic field may be expanded to allow deposition or etching over a large area and current flows may be equalized by serial driving of antennas in systems having more than one antenna. Other features reside in configurations which employ one or more multiple geometrical areas for coating or etching of square or rectangular substrates, or a linear juxtaposition for coating or etching large substrates.

The invention provides a module with a highly efficient magnetic means of transporting plasma from a plasma generator means to a substrate located on a cooled substrate holder located in a substrate process chamber and in which the processing of the substrate is highly uniform and the substrate process module is compact.

The invention provides a gas distribution means in the top of the process chamber as an integral part of the process chamber structure in order to attain highly efficient plasma operation and highly uniform processing of the substrate while permitting the process module to be reduced in height.

The invention attains highly efficient plasma operation in a compact substrate process module which can attain excellent characteristics for the etching of IC wafers as represented by high etch rate, high uniformity, high selectivity, high anisotropy, and low damage.

The invention achieves high density and highly uniform plasma operation at low pressure from 0.3 mtorr to 5 mtorr for etching an IC substrate and from 1 mtorr to 30 mtorr for deposition of films on to substrates.

The invention provides a substrate processing system capable of operating with a wide variety of gases and combinations of gases, including highly reactive and corrosive gases.

The invention provides such a substrate processing system capable of etching or depositing films listed in Table 1 and Table 2 using gases fed into the plasma generator region, the process chamber region, into one region or another, or into both regions.

BRIEF DESCRIPTION OF THE DRAWINGS

FIG. 7A is a schematic diagram of yet another example of a system in accordance with the present invention in which a bottom magnet is added behind the plane of the substrate holder to provide a magnetic cusp field, the plane of the cusp being approximately the same as the plane of the substrate holder.

FIG. 7B is a plan view of the arrangement of FIG. 7A, taken along the line 5A—5A in FIG. 7A.

DETAILED DESCRIPTION OF THE INVENTION

FIGS. 1, 2A, 2B, and 2C illustrate schematically the RF current flow in two antennas constructed according to the invention disclosed in U.S. Pat. No. 4,990,229 issued Feb. 5, 1991. For a more detailed description of the operation of these antennas, U.S. Pat. No. 4,990,229 is incorporated herein by reference in its entirety.

Figure 3:
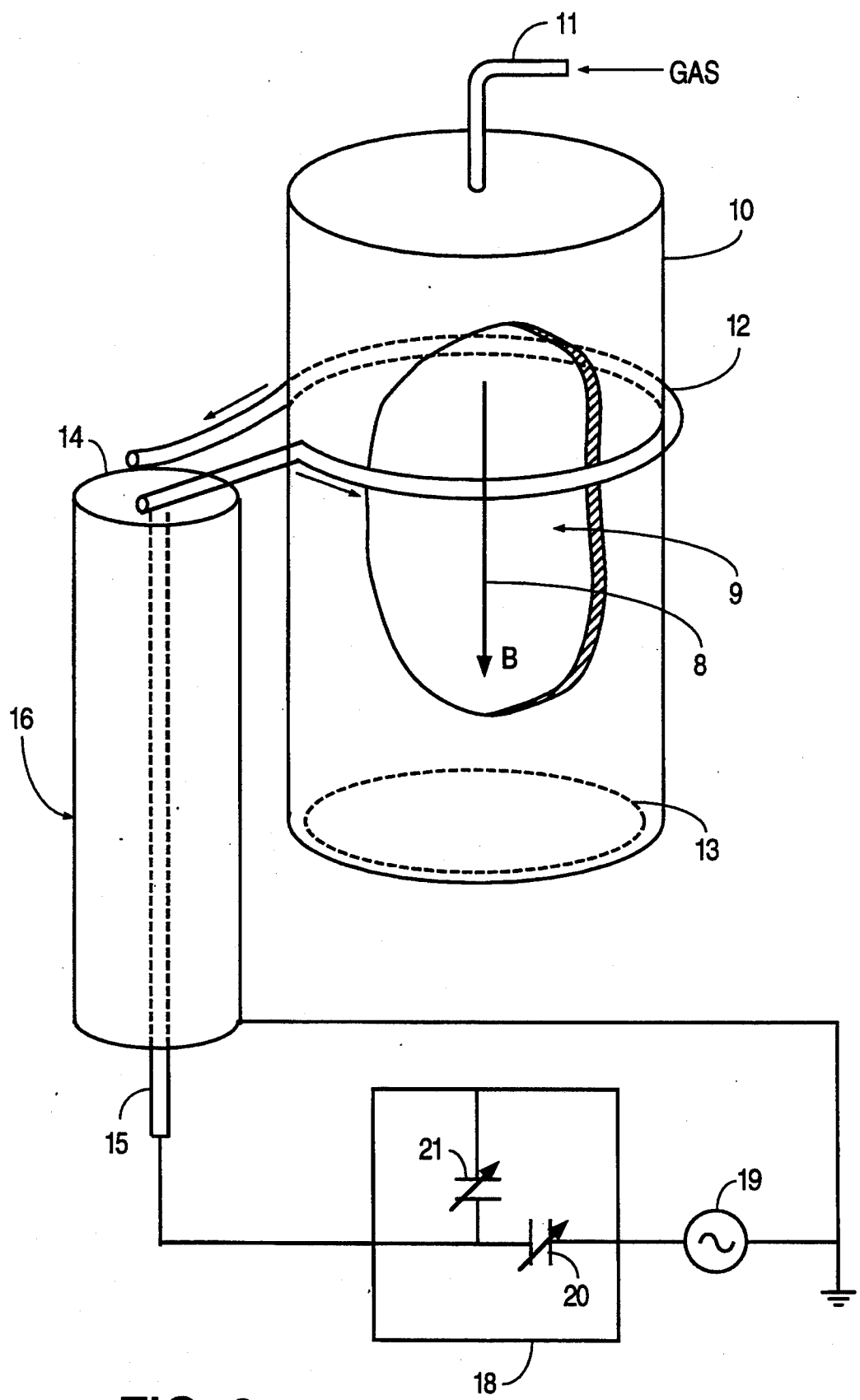
FIG. 3 is a schematic diagram depicting the principle of operation and RF current flow in a plasma source constructed according to the invention as shown in U.S. Pat. No. 5,122,251.

A simplified view of principal elements and relationships in a device in accordance with the invention is provided by the representation of FIG. 3, wherein high density plasma 9 is to be generated within a source tube 10 of generally cylindrical form about a central (here vertical) axis. At one (here upper) end an injector 11 feeds gas to be ionized into the interior volume of the source tube, where the gas is excited by an external loop antenna 12 that encompasses an intermediate region of the source tube 10. The antenna loop 12 comprises in this example a not fully circular element lying in a plane that is at 90° or less in either sense relative to the central axis. The direction of propagation of the plasma is here downward toward an exit aperture 13. The antenna loop 12 has its opposite ends coupled to the outer conductor 14 and center conductor 15 of a coaxial driver line 16 which is energized through a matching box 18 by an RF energy source 19. A pair of variable vacuum capacitors 20, 21 in the matching box 18 are adjustable to tune the circuit so that the antenna loading plus the reactive load of the matching box 18 is approximately 50 ohms to minimize the reflected power.

The antenna tuning and wave spectrum are adjusted to match the conditions in the plasma field, and also in relation to an interior axial magnetic field 8 generated by at least one magnetic field coil 22 about the source tube 10. The matching condition is predicted by theory to be dictated by the dispersion relation:

$$[\omega/\omega_c - \omega_p^2/c^2 k_z^2]^2 = 1 + (3.83/k_z a)^2$$

To effect wave coupling and establish a high plasma current density, measured in mA/cm$^2$, the antenna loop 12 is driven at 13.56 MHz and with RF energy of the order of 2.0 KW (in the range of 100 W to 5 KW) by the RF energy source 19. The magnetic field established by the coil 12 is in the range of 10 to 1000 gauss, for different useful applications. The gas is argon and maintained at a pressure of about 1 mtorr in this example. However, in addition to a noble gas such as argon, reactive gases such as $SF_6$, chlorine, oxygen, and mixtures with oxygen have been used with comparably useful results. A pressure range of 0.1 mtorr to 200 mtorr can be used if other variables are properly taken into account. With a 5 KW power supply less than the maximum available power can be used, to a substantially lower level of several hundred watts, depending on the application. Although the 13.56 MHz frequency is available from many industrial sources, the range of 2 MHz to 50 MHz can be usefully employed.

In FIG. 3, the antenna loop 12 is shown at 90° to the longitudinal axis of the source tube 10. This orientation generates the M=0 mode, while reducing the angle from 90° in either sense introduces components of the M=1 mode as well as components of the M=0 mode. Angles of less than 90° to the longitudinal axis require correspondingly longer antenna loops 12, so there is a practical limit of about 45° to the angle which can be used. Most orientations are preferred to be in the range of 60° to 90°. It should be noted that the loop 12 is disposed within a flat plane that is directly perpendicular or tilted to the longitudinal axis. In the prior art constructions with double loops and other configurations it has usually been postulated that the looped portions must describe a helical path in order to establish a helical wave property, but this is disproven by the results given below as to the efficacy of the present invention. It is important, however, that the antenna loop 12 be sufficiently spaced apart from the closed (gas entry) end of the source tube 10 for the necessary interactions to occur between the plasma and the RF energy, and for the dispersion relation to be satisfied so that proper excitation can be realized and high density can be achieved. Too long a length, however, can also preclude establishment of the proper wave numbers. In practice source tubes 10 of 1″ to 4″ in diameter and 8″ to 9″ in length have been used, with the antenna loop being about one-third or more of the distance from the closed end.

This arrangement establishes low frequency whistler waves, but the mechanism of the wave energy-plasma interaction is not fully understood. Simple analysis in accordance with the dispersion relation is not feasible. The presence of the plasma load in the RF field appears to give rise under proper conditions to selective interactions in which the gas density and dielectric characteristics determine the wave numbers that exist. In a sense, therefore, the plasma itself appears to predetermine the wavelengths for interaction, and thus the value of $k_z$, out of the spectrum of radiation from the antenna that excites the plasma.

The physics of whistler wave propagation in plasmas has been studied in other contexts. In a cylindrical geometry these waves are generally referred to as helicon waves. The classical helicon wave was first investigated by Lehame and Thonemann and is governed by the following equations:

$$\nabla \times \underline{E} = \delta \underline{B}/\delta t, \quad \nabla \times \underline{B} = \mu_0 \underline{i}, \quad \nabla \cdot \underline{B} = 0$$

$$E = i \times \underline{B}_0/en_o, \quad E_z = \eta J_z$$

where E is the electric field, B is the magnetic field, i is the current density, $B_o$ is the vacuum magnetic field, e is the charge on an electron, $n_o$ is the density of the plasma and $\eta$ is the resistivity of the plasma.

Following the derivation of Chen one can easily find perturbations of the form $B \exp(i(m\theta + k_z Z - \omega t))$, and in the limit as $\eta$ tends to 0, the above equations lead to:

$$\nabla^2 B + \alpha^2 B = 0$$

where $\alpha = (\omega/\kappa)(\mu_o e n_o/B)$
where $i = (\alpha \mu_o) B$
and $\omega$ is the angular frequency of the wave, $\mu_o$ is the permittivity, k is the wave number, $2\pi/\lambda$, where $\lambda$ is the wavelength. These equations can be solved in cylindrical coordinates to yield the dispersion relation:

$$m\alpha J_m(Ta) + Tka J_m'(Ta) = 0$$

where, $J_m$ is a Bessel function of the first kind, $J_m'$ is a derivative of $J_m$ with respect to its argument, a is the plasma radius and T is a transverse wave number defined by $$T^2 = \alpha^2 - k^2$$

It is important to remember that m is the mode number that describes the $\theta$ dependence of perturbations of the form $B \exp(i(m\theta + k_z - \omega))$.
The two lowest modes satisfy $$J_1(Ta) = 0 \qquad (m=0)$$

$$J_1(Ta) = Tka/2\alpha(J_2 - J_o) \qquad (m=1)$$

This leads to the simple relation $$[(\omega/\omega_c) - (\omega_p^2/c^2 k_x^2)]^2 = 1 + (3.83/k_z a)^2$$

where
$\omega_c$ = cyclotron angular frequency
$\omega_p$ = plasma frequency
for the m=0 mode. The above derivation is important to understand the excitation of the desired mode by the antenna.

Another important mechanism to understand is the damping of the wave by the plasma. In the papers by Boswell, wave damping by electron collisions could not explain the experimentally observed results. Chen, however, determined that Landau damping was responsible for the large damping observed experimentally. Landau damping is a collisionless damping of waves in a plasma due to particles in the plasma that have a velocity nearly equal to the phase velocity of the wave. These particles travel with the wave, do not see a rapidly fluctuating electric field and so can effectively exchange energy with the wave. In a plasma, there are electrons both faster and slower than the wave. In a Maxwellian distribution, however, there are more slow electrons than fast ones and so there are more particles taking energy from the wave than vice versa.

The damping rate due to Landau damping has been calculated by Chen for helicon waves and can be expressed as:

Damping Rate = $Jm(k_z)/Re(k_z) 2\pi c^2 (3.8/a)^2 \xi^3 e - \xi^2$
where $\xi = \omega/k_z V_{th}$ and $V_{th}$ is the thermal velocity of the plasma electrons. It is of interest to demonstrate how sensitive the damping rate is to the value of k because it is such a steep function of $\xi$. Take for example a plasma with a density of $10^{12}$ electrons/cm$^3$, an electron temperature of 3 eV and a driving frequency of 8 MHz. The collisional damping rate would be 0.065 and the Landau damping rate would be 0.6 for $k_z = 0.25$ cm$^{-1}$ and 0.0005 for $k_z = 0.125$ cm$^{-1}$. It is clear that Landau damping is the important damping mechanism and that it is very dependent on the wave number $k_z$.

There are a number of factors important in devising an antenna structure which excites whistler waves for generation of plasmas, including a) frequency of excitation, b) wave mode and c) efficiency of coupling RF power to plasma. The frequency of the waves should be such that it satisfies $\Omega_c < \omega < \omega_c$ where $\Omega_c$ is the ion cyclotron frequency, $eB_o/M_i$ and $\omega_c$ is the electron cyclotron frequency $eB_o/M$. These waves are low frequency waves that operate far below the electron cyclotron frequency.

The mode structure of the wave electric and magnetic fields should be understood so that the antenna arrangement can efficiently couple the RF power into wave excitation. As discussed above, the two lowest modes are the m=0 and m=1 modes. The mode structure of the wave electric field for an m=0 mode has radial and circumferential electric field vectors, spatially disposed at different transverse planes along the direction of wave travel, z. Within a wavelength of wave travel, the electric field varies between purely radial and purely azimuthal. The azimuthal electric field varies between being anticlockwise at one plane and being clockwise one-half wavelength away. With this understanding, it is found that the wave can be efficiently excited in this mode with an antenna that has a single loop located in a plane perpendicular to the magnetic field generating a spectrum of wave numbers such that a portion of the spectrum generated includes $2\pi/k_z$, where $k_z$ is given by the stated dispersion relation. The mode structure of the wave electric field for an m=1 mode imparts a natural helical pitch to the electric and magnetic field vectors as the wave propagates along the z direction. The electric field vector rotates in a right-handed sense, i.e., it rotates clockwise as it travels along $B_o$ which is in the z direction. This mode can be excited with the present invention if the single loop is canted at an angle to the magnetic field such that the wave spectrum generated contains a significant portion around $2\pi/k_z$, where $k_z$ is given from the dispersion relations.

The efficiency of plasma production depends on the coupling of RF energy into the plasma. As discussed above, the important mechanism for damping of the RF energy is believed to be Landau damping. The phase velocity of the whistler wave is given by $\omega/k_z$, where $k_z$ is given by the dispersion relation and depends on the plasma density and magnetic field strength without plasma. Ideally, the phase velocity of the wave should be near the maximum of the ionization potential of the gas we wish to ionize. From the above dispersion relation for the m=0 mode:

$$n = \alpha B_o k_z (T^2 + k_z^2)^{\frac{1}{2}}$$

where $\alpha = B_o k_z^2$ for $T < k_z$.

In other words, the higher the value of $k_z$, the higher the density. However, the phase velocity of the wave is $\omega/k_z$ and so increasing $k_z$ decreases the energy of the electrons that are accelerated by the wave. If the $k_z$ is too high, then the energy of the electrons may fall below the ionization potential. It is therefore important to control $k_z$ in order to be able to increase the density and control the electron temperature.

The present invention uses low frequency whistler waves to generate plasmas with high density exceeding $10^{13}$ per cm$^3$. The first use of whistler waves to generate dense plasmas was described by Boswell, who used an antenna arrangement having current flows along the axis of the cylinder. This antenna configuration had been used and previously described by Ovchinnikov and excites the m=1 mode due to the current flow in conductors running parallel to the direction of the magnetic field $B_o$. The frequency of excitation was 8 MHz, and the density profile of the 10 cm plasma was found to be quite peaked, particularly at the higher magnetic field strengths needed for high densities. In these publications, the mechanism for efficient coupling of the RF energy to the plasma could not be explained. Chen, in an Australian National University report, explained the mechanism as Landau damping.

Chen, in a paper presented in August 1988, described a system using whistler waves to generate dense plasmas for use in advanced particle accelerators. The type of antenna used in this arrangement was similar to that used by Boswell in that it excited the m=1 mode and was of a type known as the Nagoya Type III antenna, having circular end loops at spaced apart conditions excited with opposite phase signals.

A number of variables can be utilized once it is recognized that the single loop antenna in accordance with the present invention efficiently establishes a high density plasma. The Z axis wave number, $k_z$, varies as the ratio n/B, and inversely with wavelength $\alpha$, requiring a longer source tube. Conversely, if B is decreased, the plasma density is relatively higher because the shorter wavelengths function to create needed wave numbers regardless of tube size.

The results of the present approach are best evident from study of different process units as described below.

Figure 4A:
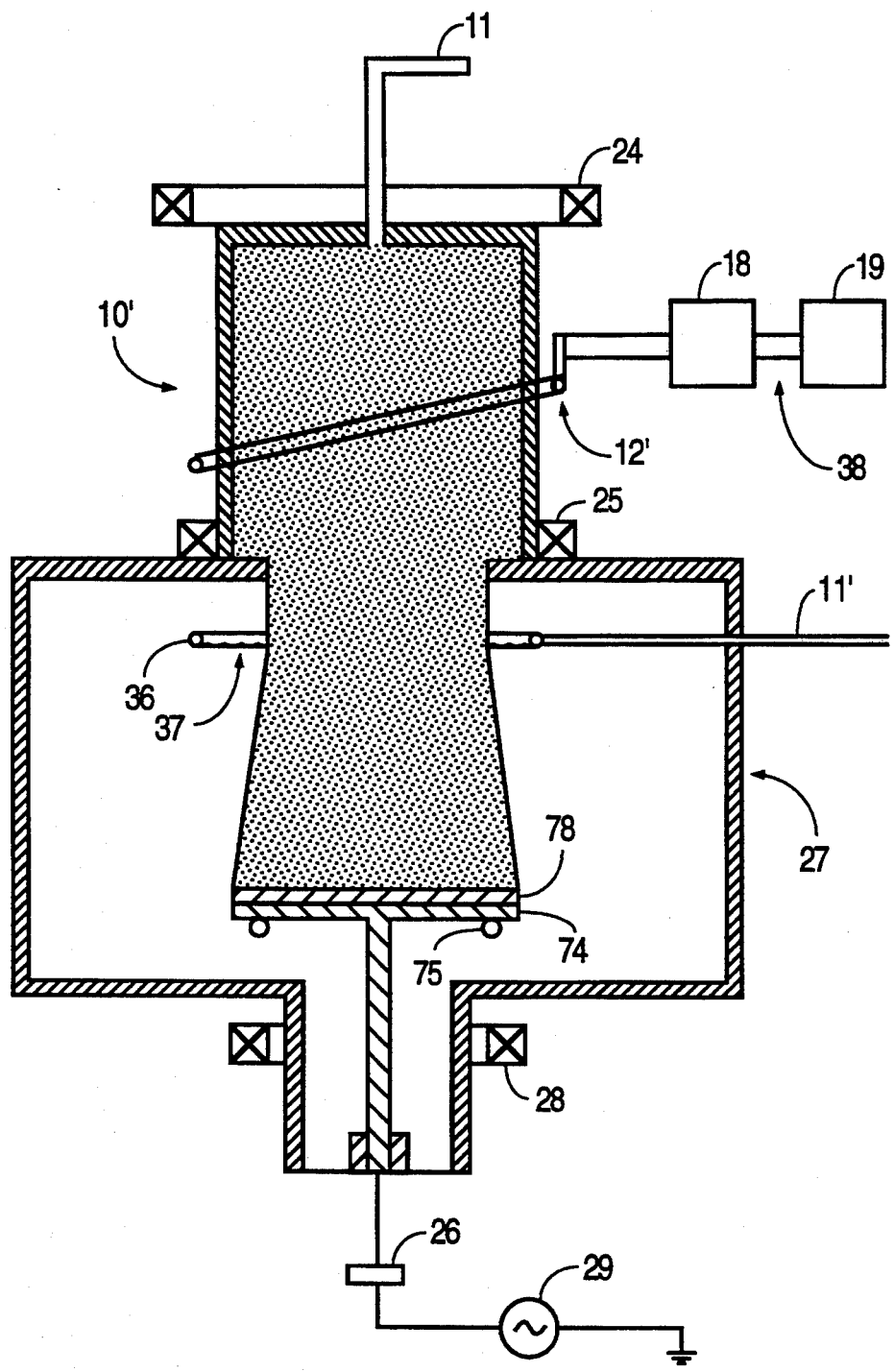
FIGS. 4A and 4B illustrate in schematic form two basic configurations of a plasma deposition or etching apparatus accordance with this invention.

The basic configuration of a plasma deposition or etching apparatus according to the present invention is shown in FIG. 4A. The plasma generation chamber 10' is cylindrical in shape and is made of a non-conducting material such as quartz or pyrex. The antenna 12' is mounted at an inclination to the longitudinal axis of the chamber 10' as described in conjunction with FIG. 3. An axial magnetic field is provided by magnetic field coils 24 and 25 as shown in FIG. 4A, but the plasma can also operate using only one of these coils.

The plasma is transported by the magnetic field to a separate process chamber 27. The shape of the plasma emerging into the process chamber 27 can be controlled by varying the amount and direction of the current made to flow in a coil 28 about the exit of the chamber 27. A substrate 78 to be coated or etched is mounted on a substrate holder 74 which is electrically isolated. Plasma that bombards the substrate 78 causes the substrate 78 to reach a negative self bias of between 0 and 10 V. For some films to be formed, it is advantageous for the film to be bombarded by ions with greater energy than they would obtain due to the self-bias. In this case, it is desirable to apply RF power from a second RF source 29 through a second matching circuit 26. The substrate holder 74 is a copper block that is cooled or heated by a heating/cooling circuit 75. Gas is injected via a stainless steel injection tube 11' connected to the source for the plasma generation chamber 10'. A stainless steel ring 36 has a diameter that is large compared to the size of holes 37 that are distributed equally around the ring 36. This arrangement is such that a uniform flow of gas is directed towards the substrate 78. The RF voltage is applied to the antenna 12 by means of a matching circuit 18 and RF source 19, as described in conjunction with FIG. 3. Tuning in the matching circuit 18 is used to maximize the power that is coupled into the plasma and minimize the power that is reflected back along a 50 ohm cable 38 to the RF power supply 19.

Figure 4B:
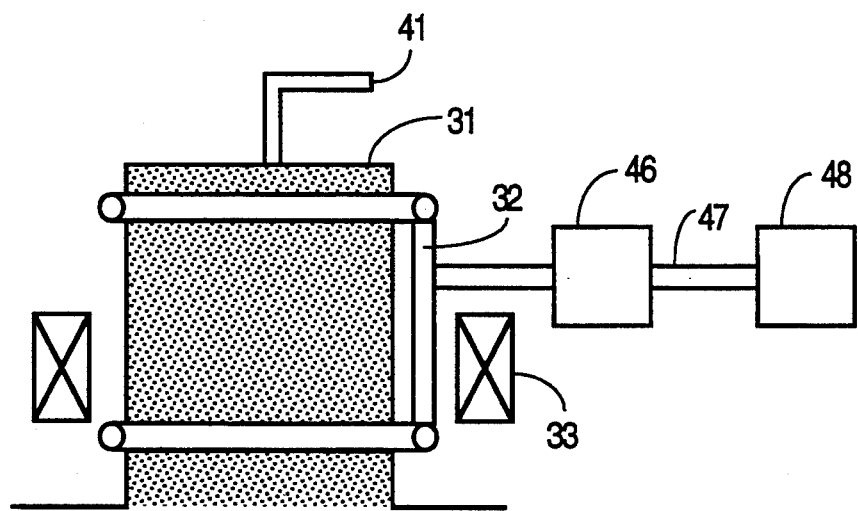

FIG. 4B shows a plasma generation chamber 31 with a gas inlet 41. An RF power supply 48 provides, through an RF matching circuit 46, RF power to antenna 32. This matching circuit maximizes the power coupled into the plasma and minimizes the power that is reflected back along cable 47 to the RF power supply 48. Magnetic field coil 33 is the single magnet used to create the axial magnetic field to transport the plasma to a separate process chamber (not shown) located beneath the plasma generation chamber 31.

Figure 5A:
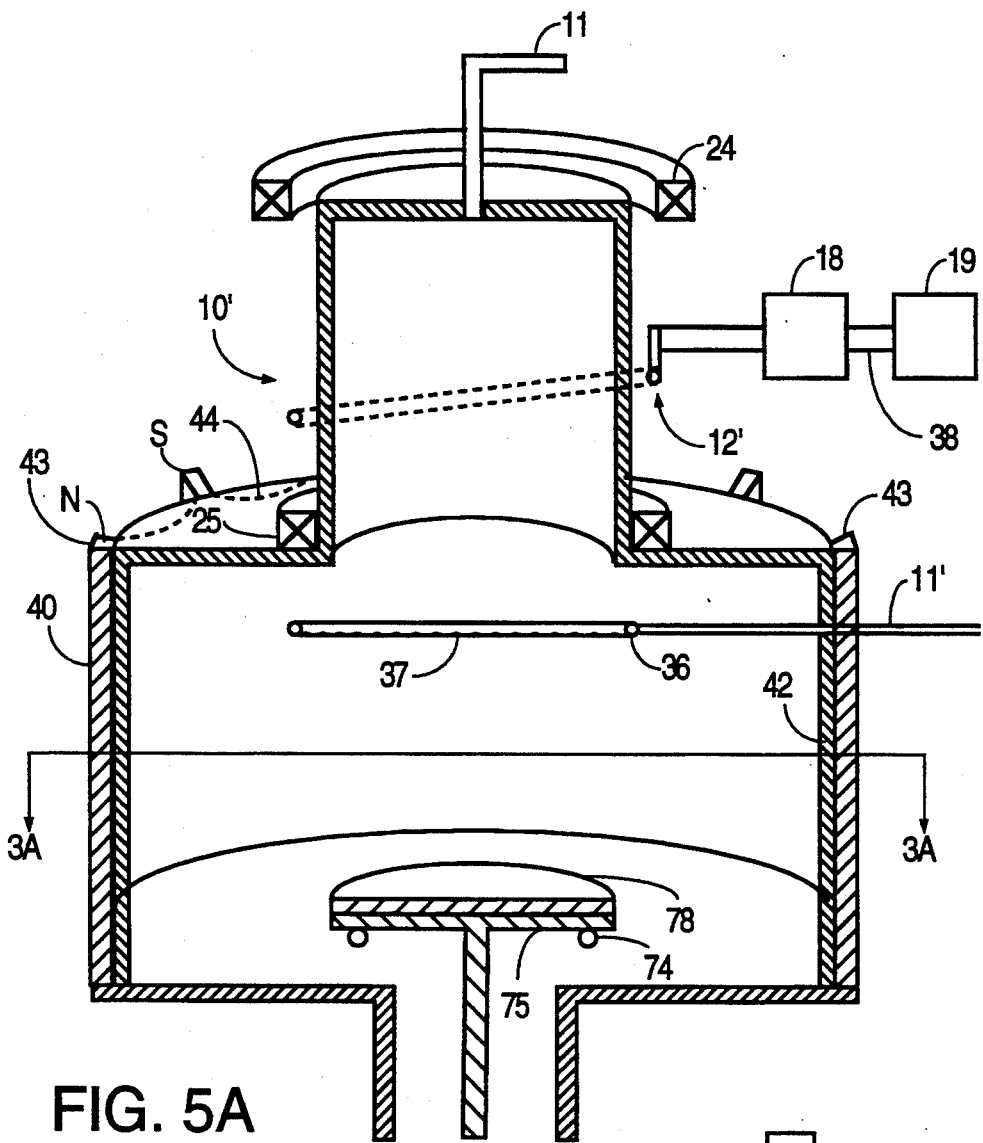
FIG. 5A is a schematic diagram of a second example of a system in accordance with the present invention in which the plasma source region is connected to a magnetic bucket region where uniformity requirements are important.

FIG. 5A shows an arrangement where high uniformity over a large area is required. The plasma generation chamber 10' is cylindrical in shape and is made of a non-conducting material such as quartz or pyrex. The antenna 12 is mounted at an angle less than the perpendicular, but otherwise corresponds to the configuration described in FIG. 3. An axial magnetic field is provided by the magnetic field coils 24 and 25. The plasma is transported by the magnetic field to a process volume comprising a part of a magnetic bucket chamber 40.

In a paper by Limpaecher and MacKenzie (R. Limpaecher and K. R. MacKenzie, Rev. Sci. Instrum. 44,726 (1973)), it is disclosed that using magnets in a peripheral multicusp arrangement can provide very uniform plasma parameters in a central zone of the volume enclosed by the magnets. The arrangement of the magnets around the circumference of a cylinder is a common arrangement used for ion sources and is referred to as a magnetic bucket. It is important to design the magnetic field in such a way that there is a good match between the axial field provided by the lower magnetic field coil 25 and the field in the magnetic bucket 40. The plasma from the plasma generation chamber 10' diffuses along the magnetic field lines and expands to fill the magnetic bucket 40. The wall 42 for the magnetic bucket 40 is made of stainless steel and can be of, for example, circular or rectangular cross-section. In either case the interior dimensions of the magnetic bucket 40 are such that it is larger than the interior diameter of the plasma generation chamber 10'. The magnetic field within the magnetic bucket 40 is provided by a number of permanent magnets 43 arranged with their poles perpendicular to the wall 42 of the magnetic bucket 40 and with alternating north N and south S poles.

Figure 5B:
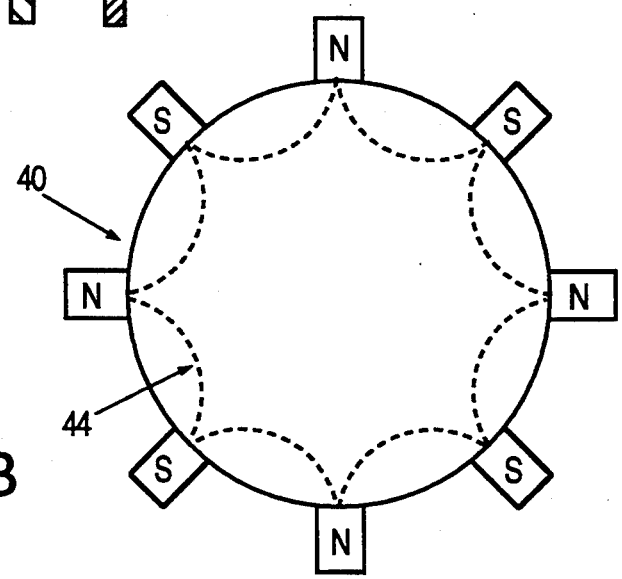
FIG. 5B is a plan view of the arrangement of FIG. 5A, taken along the line 3A—3A in FIG. 5A.

With this arrangement, the magnetic field lines 44 follow a multicusp pattern, the field pattern provided by the magnets being as is shown in FIG. 5B. Referring again to FIG. 5A, a substrate 78 to be coated or etched is mounted on a substrate holder 75 at the lower region of the plasma field in the magnetic bucket 40. The substrate holder 75 is a copper block that is cooled or heated by a heating/cooling circuit 74. As in the system of FIG. 4, gas is injected via stainless steel tube 11' connected to the gas source for the plasma generation chamber 10', and into the magnetic bucket 40 via a stainless steel ring 36 that is connected to the gas feed and includes small diameter holes 37 that are distributed equally around the ring 36. A uniform flow of plasma is directed towards the substrate 78, as an RF voltage from a power supply 19 is applied to the antenna 12 by means of a matching circuit 18 which consists of two vacuum capacitors as described in FIG. 3.

Figure 6A:
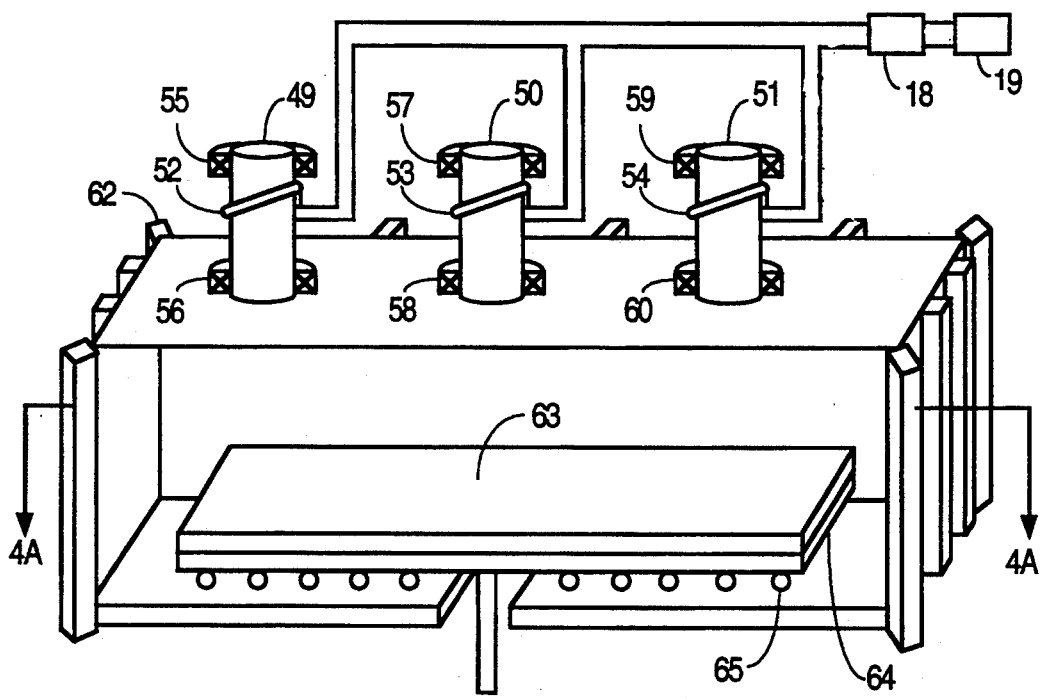
FIG. 6A is a perspective view of a third example of a system in the present invention for deposition or etching over a large rectangular area where uniformity is important.
Figure 6B:
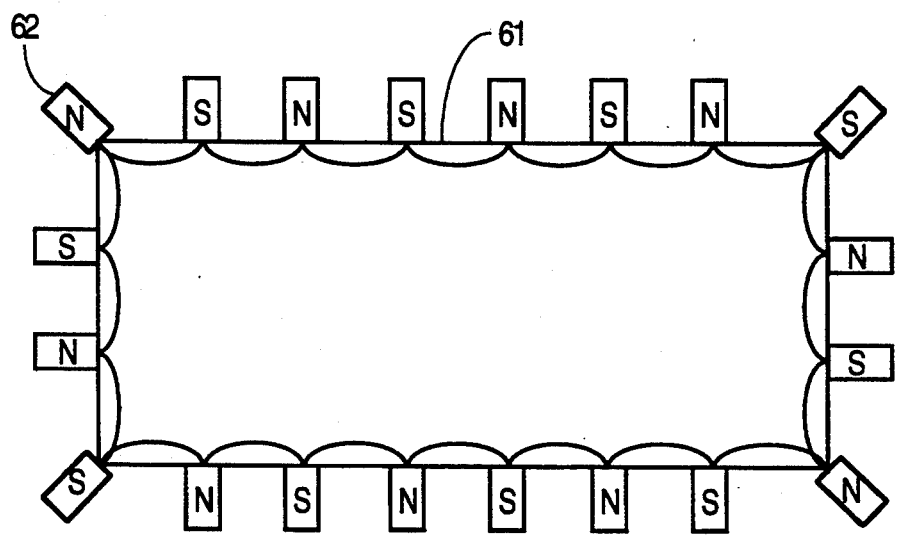
FIG. 6B is a plan view of the arrangement of FIG. 6A, taken along the line 4A—4A in FIG. 6A.

FIG. 6A shows an arrangement where high uniformity over large rectangular shaped areas is required such as needed in the coating of large flat displays. The plasma generator units are of the type described above, but, in this arrangement, multiple generators may be used depending on the size and shape of the plasma needed. In FIG. 6A, three plasma generation chambers 49, 50 and 51 are shown, disposed along the central axis of the top of a process chamber. Each plasma generation chamber 49, 50 or 51 is cylindrical in shape and made of non-conducting material such as quartz or pyrex, and each includes a separate single loop antenna 52, 53 or 54 of the type described in FIG. 3. However, to assure that uniform plasmas are generated, the antennas 52, 53, 54 are coupled in electrical series to the matching box 18 and RF power supply 19, so that equal RF current flows are assured. An axial magnetic field for each plasma generation chamber 49, 50 or 51 is provided by magnetic field coils 55 and 56, 57 and 58, or 59 and 60, respectively. The plasmas thus separately generated are transported by the magnetic field into a common rectangular magnetic bucket chamber 61. The plasmas diffuse along the field lines and expand to fill the magnetic bucket chamber 61. The magnetic field within the magnetic bucket chamber 61 is provided by permanent magnets 62 arranged with their poles perpendicular to the surface of the magnetic bucket chamber 61 and with alternating N and S poles. The magnetic field pattern provided by the magnets is shown in FIG. 6B. The substrate 63 to be coated or etched is mounted on a substrate holder 64 which is electrically isolated. Plasma that bombards the substrate causes the substrate to reach a negative self bias of between 0 and 10 V. For some films to be formed or in some etching applications, it is advantageous for the substrate 63 to be bombarded with energetic ions. In this case it is desirable to apply RF power from a second RF power supply (not shown) through a matching circuit to the substrate holder 64, which again may be a copper block that is cooled or heated by a heating/cooling circuit 65.

FIG. 7A is another example of a device in accordance with the invention, for providing additional control of plasma uniformity over a large area. The plasma generating chamber 10' is cylindrical in shape, of non-conducting material such as quartz or pyrex, and surrounded by an antenna 12' at an angle less than 90°. An axial magnetic field is provided in the source region by the magnetic field coils 69 and 70 or by only one such coil. The plasma is transported by the magnetic field from the source 67 to a magnetic bucket chamber 71 which is substantially of the same design as described for FIG. 5A. To enhance uniformity and to ease the transition of plasma into the magnetic bucket chamber 71, an additional magnetic field coil 72, concentric with the central axis of the plasma generating chamber 10' is located below the substrate holder 74 which is cooled or heated by a heating/cooling circuit 75. The permanent magnets 76 about the magnetic bucket chamber 71 are arranged as described earlier in FIG. 4 and create a magnetic cusp field 77 as seen in FIG. 7B. The current in the additional magnetic field coil 72 is made to carry a current in the direction opposite to that of the currents made to flow in coils 69 and 70. The effect is to create another magnetic cusp, now a ring cusp, located approximately in the plane of the substrate 78, such plane being substantially perpendicular to the line cusps created by the North-South permanent magnets 76.

Gas is injected as above by an injection port 11 into the plasma generation chamber 10' and by another feed tube 11' through a stainless steel ring 36 into the bucket chamber 71. The ring 36 has a diameter large compared to the size of holes 37 directing a uniform flow of gas to the substrate 78. The ring 36 can also be the gas feed for the source when the main feed is not used. Small amplitude variations with time in the current flowing in the coil 72 are generated by a modulating driver 73 to cause the ring cusp plane to fluctuate up and down about the plane of the substrate 78, thereby time averaging the plasma profile incident across the substrate and further enhancing uniformity. This approach of using the time-variation of a bottom coil can also be employed to enhance uniformity when a magnetic bucket is not employed by using the arrangement shown in FIG. 4 and by running the current in coil 28 in the exit region therein opposite to that in coils 24 and 25 at the plasma generation chamber 10', thereby creating the ring cusp in the plane of the substrate as just described.

Figure 8:
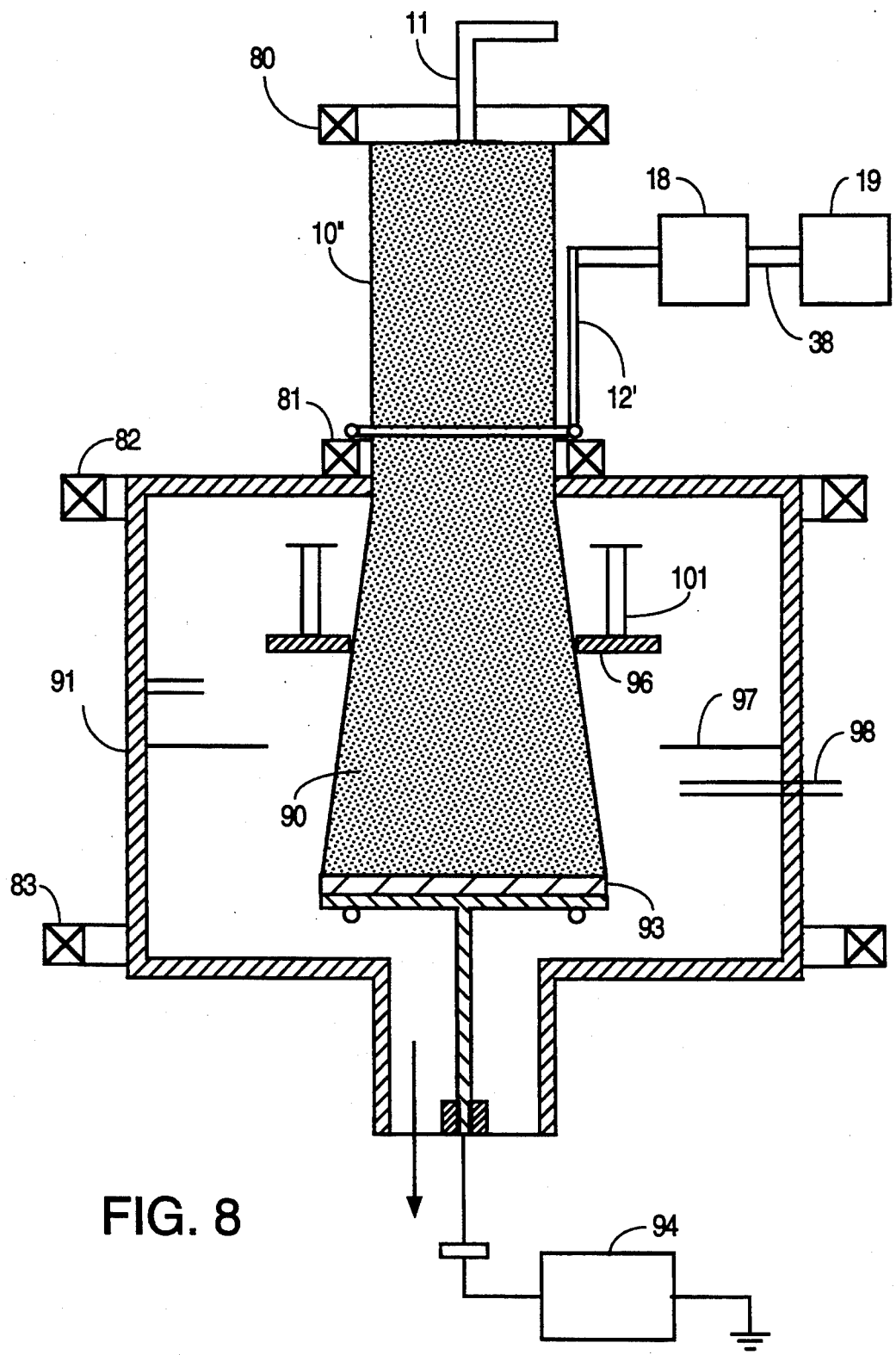
FIG. 8 is a schematic diagram of an example of a system in accordance with the invention for sputter deposition.

FIG. 8 is another exemplification according to the present invention that is suitable for using the RF generator system in conjunction with a sputter target. The plasma generator chamber 10" is cylindrical in shape, of nonconducting material, and surrounded by an antenna 12' mounted in a plane perpendicular to the longitudinal axis, as in the example of FIG. 3. An axial magnetic field is provided by the magnetic field coils 80 and 81 about the plasma generator chamber 10" and the magnetic field coils 82 and 83 about a process chamber 91. The plasma 90 is transported from the plasma generator chamber 10" into the process chamber 91 and flows along the magnetic field to a lowermost sputter target 93 which is biased to a large negative voltage (about −700 V) by a power supply 94. A DC power supply is used to maintain a charge when the substrate holder is conductive, but if the substrate holder is non-conductive an alternating current power supply is employed instead. The plasma diameter is made to conform to that of the sputter target 93 by controlling the magnetic field. The material sputtered from the sputter target 93 is deposited on the substrates 96 juxtaposed about it. A horizontal baffle 97 in a plane above the sputter target 93 may be used to control the gas pressure near the substrates 96 and other gases may be introduced near the substrates 96 through outlet 98. The substrates 96 are mounted on a substrate holder 101 and are positioned above the sputter target 93. The substrate holder 101 can rotate about the vertical axis to enhance uniformity of deposition of sputtered material. The substrate holder 101 has a central aperture to permit plasma to pass along the magnetic field from the plasma generator chamber 10" to the sputter target 93.

Figure 9:
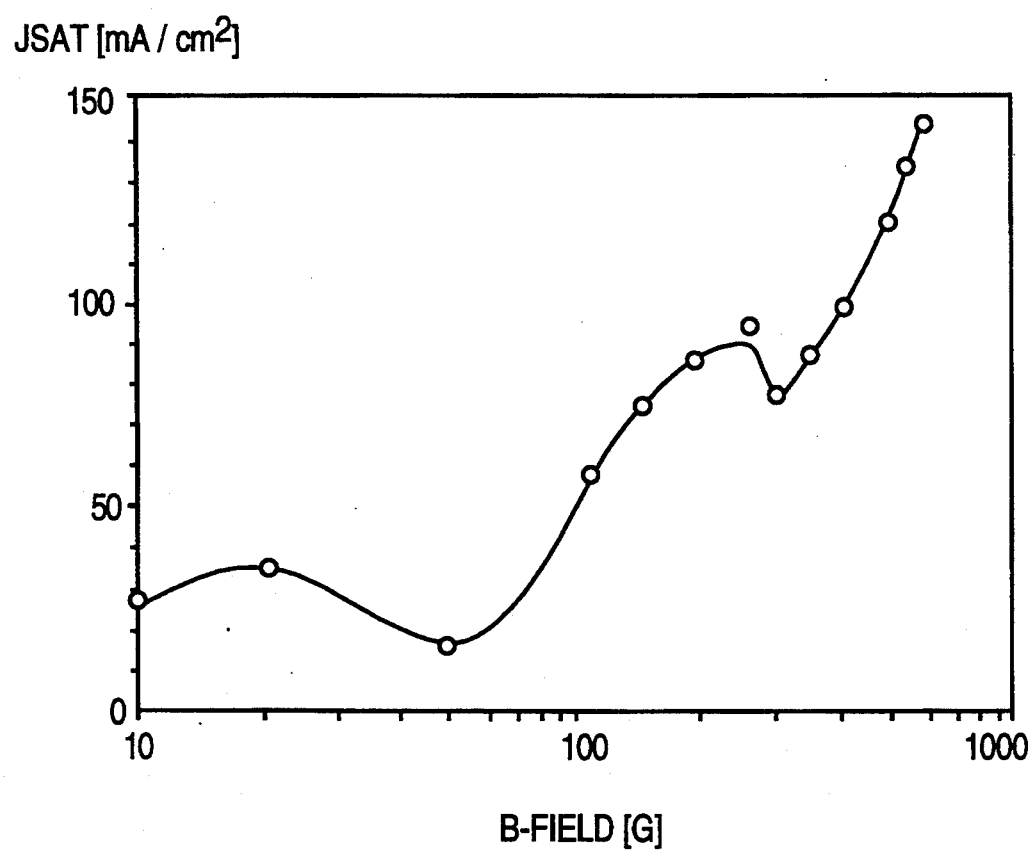
FIG. 9 is a graph depicting the plasma current density at the substrate location according to the example of FIG. 5A using the plasma source depicted in FIG. 3 as a function of magnetic field in the source region.
Figure 10:
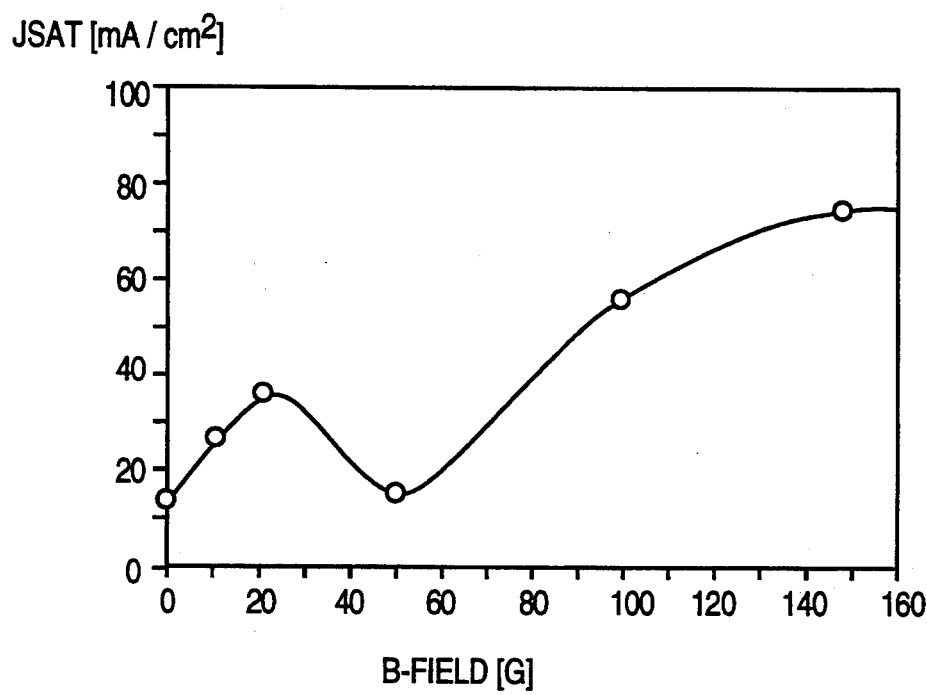
FIG. 10 is a graph of the same data as in FIG. 9 but graphed on a linear scale for magnetic field to show the plasma current density at the substrate location where the magnetic field is low, varying from zero to 160 gauss.

Data is shown in FIG. 9 on the plasma current density measured in $mA/cm^2$ produced according to the present invention in the arrangement shown in FIG. 5A using the antenna shown in FIG. 3 and measured by using a fast-injection Langmuir probe at a location just above the plane of the substrate. The vertical axis represents plasma current density and the horizontal axis represents magnetic field strength in FIG. 9 and in FIG. 10 below. The RF frequency was 13.56 MHz and was supplied using a commercial RF power supply generating 2.0 KW passing through a matching box as shown in FIG. 3. Data was obtained for the plasma current density as a function of magnetic field in the plasma generation chamber 10' from zero to 1000 gauss. The data for field varying from zero to 160 gauss is shown in FIG. 10. The gas pressure is about 1 mtorr. A substantial current density approaching 40 $mA/cm^2$ is found at a low value of field equal to 20 gauss. Increase of the magnetic field to 100 gauss and above also produces high values of plasma current density, achieving levels of 140 $mA/cm^2$. These data establish that resonances exist at low field values to give surprisingly high and novel plasma current densities. Resonances again arise, in monotonically increasing relation to field strength, after an intermediate range in which current densities are lower.

Figure 11:
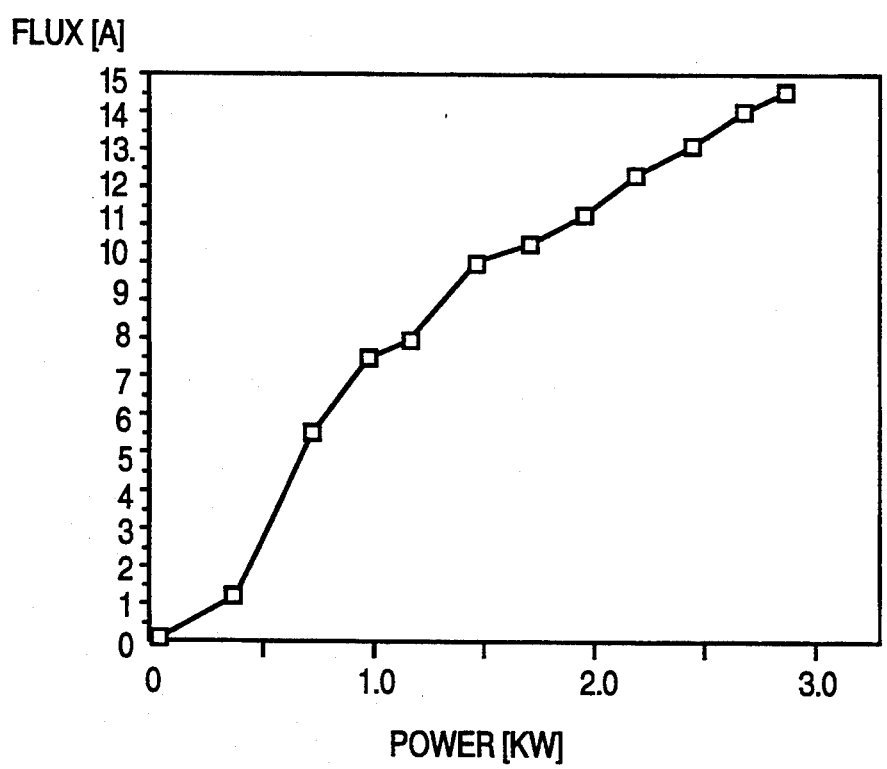
FIG. 11 is a graph depicting the total plasma current (or total flux) at the substrate location according to the invention as depicted in FIG. 5A using the plasma source as depicted in FIG. 3 as a function of RF power to the source at a gas pressure of 2 mtorr.

In FIG. 11, data is shown for the total plasma flux (vertical axis) measured in Amperes reaching the substrate plane as a function of RF power (horizontal axis) measured in KW for a gas pressure of 2 mtorr and a magnetic field in the source chamber of 250 gauss. The total flux achieved is over a diameter of 8 inches (20 cm). The total flux incident onto the substrate reaches as high as 15 Amperes from a source with a chamber diameter of about 4" (10 cm).

Figure 12:
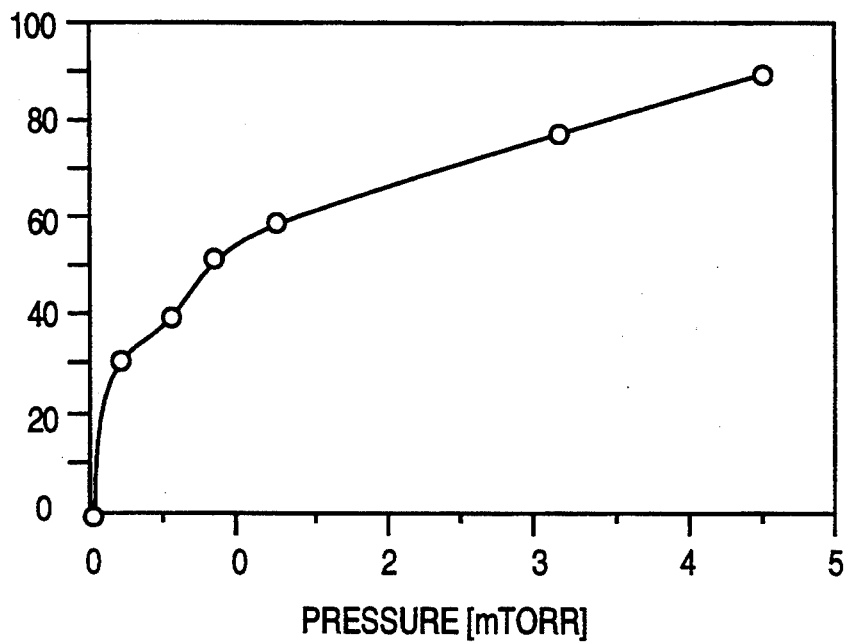
FIG. 12 is a graph depicting the plasma current density at the substrate location according to the invention as depicted in FIG. 5A using the antenna as depicted in FIG. 3 as a function of the gas pressure.

FIG. 12 depicts operation of the plasma source (plasma current density measured in $mA/cm^2$ along the vertical axis) in the arrangement described in FIG. 5A with the antenna as described in FIG. 3 as a function of gas pressure (horizontal axis) in the chamber, demonstrating that the source operates effectively at low pressures (below 1 mtorr) up to higher pressures. The source has been run successfully at pressures greater than 100 mtorr.

Figure 13:
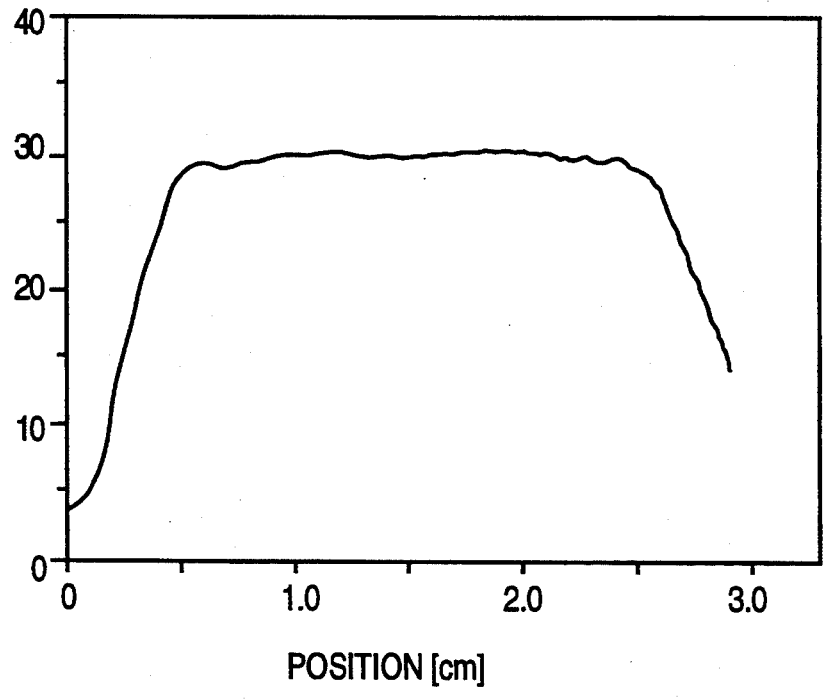
FIG. 13 is a graph depicting the plasma current density at the substrate location according to the invention as depicted in FIG. 5A and the plasma source of FIG. 3 as a function of position to show the excellent uniformity over a substantial width.

The uniformity of the plasma is shown in FIG. 13, said uniformity measured at a distance 6" below the exit of the plasma generation chamber 10' in the magnetic bucket 40 with a substrate 78 in place using the arrangement shown in FIG. 5A and the antenna 12 as depicted in FIG. 3. The vertical axis shows plasma current density measured in $mA/cm^2$ and the horizontal axis shows the position within the substrate process chamber measured in centimeters. The magnetic field in the plasma generation chamber 10' is 150 gauss and the pressure is about 2 mtorr. The plasma is highly uniform over a width exceeding 8" (20 cm). A similar degree of uniformity is achieved using the cusp magnetic arrangement depicted in FIG. 7A, employing the magnetic field coil 72 carrying a current in a direction opposite to the current flowing in the magnetic field coils 69 and 70.

Consequently it will be appreciated that systems and devices in accordance with the invention provide uniform plasmas utilizing low frequency whistler wave excitations using a single loop antenna with a plasma generation chamber. By interaction with the plasma load under an appropriate magnetic field condition and with selected RF power, an extended plasma in a plasma generation chamber can cover a wide area of shaped areal characteristic, if desired, with high plasma current density and high total plasma flux. Both low and high magnetic field strength modes are sustainable, and etching, deposition and sputtering processes can be employed.

Figure 16B:
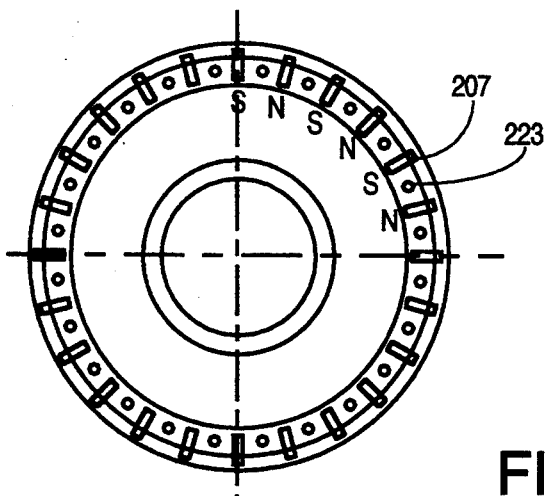
FIG. 16B is a plan view of the substrate process chamber section of the arrangement of FIG. 16A taken along the line 7A—7A in FIG. 16A.
Figure 16A:
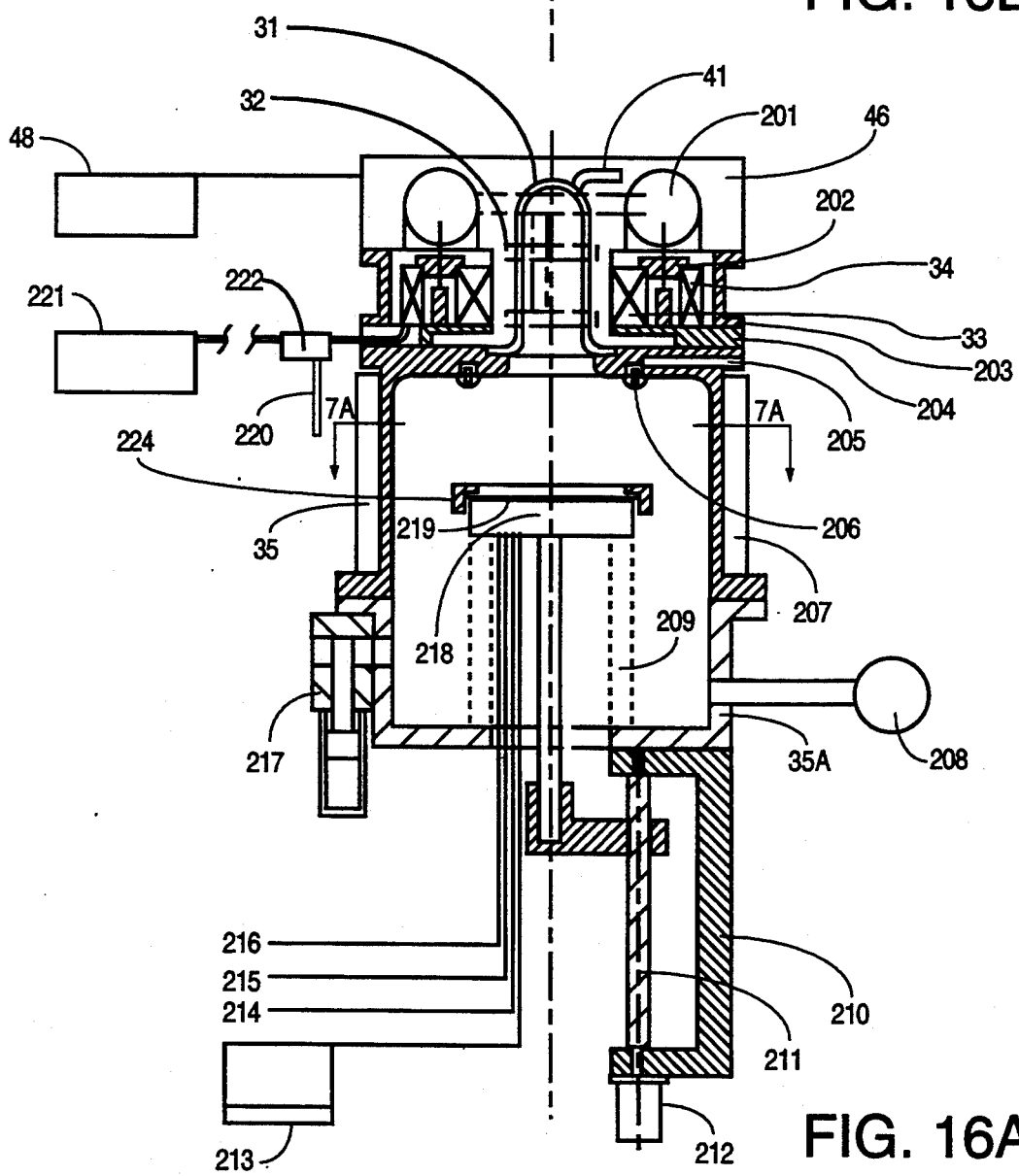
FIG. 16A is a schematic diagram of the configuration of a plasma etching or deposition apparatus.

FIG. 16A is a schematic diagram of a configuration of a plasma etching or deposition apparatus. FIG. 16B is a plan view of a substrate process chamber section of the arrangement of FIG. 16A taken along the line 7A—7A in FIG. 16A. In FIG. 16A, gas feed 41 enters plasma generator tube 31 near the top of plasma generator tube 31. Inner magnet coil 33 and outer magnet coil 34 surround plasma generator tube 31. RF antenna 32 surrounds plasma generator tube 31. RF power supply 48 provides, through an RF matching box 46, RF power to RF antenna 32. Plasma generator tube 31 is attached to the top of substrate process chamber 35. A capacitor 201 is formed adjacent plasma generator tube 31. A clamp 202 and a collar 203 help hold magnet coils 33 and 34 in place on base plate 204. Gas is fed through gas feed line 205 into substrate process chamber 35 through gas injection nozzle 206. A plurality of ceramic magnets 207 surround substrate process chamber 35, as best shown in FIG. 16B. A pump 208 adjoins substrate process chamber 35 near the bottom 35a of substrate process chamber 35. A chuck motor 212, lead screw 211 and chuck actuator 210 move a chuck 218 up and down within substrate process chamber 35. A wafer substrate 219 is held in place on chuck 218 by clamp ring 224. Cooling water enters substrate process chamber 35 and travels to chuck 218 along path 216 and exits along path 215. Helium for cooling wafer substrate 219 enters substrate process chamber 35 along path 214. RF power supply 213 supplies power to chuck 218. A metal bellows 209 encloses an area underneath chuck 218. A gate valve 217 is formed on the side of substrate process chamber 35 opposite the side on which pump 208 is formed. A DC power supply 221 controls separation unit 222 to control the flow of cooling water along path 220. As seen in FIG. 16B, cooling water holes 223 are formed in bottom 35a of substrate process chamber 35.

Figure 1:
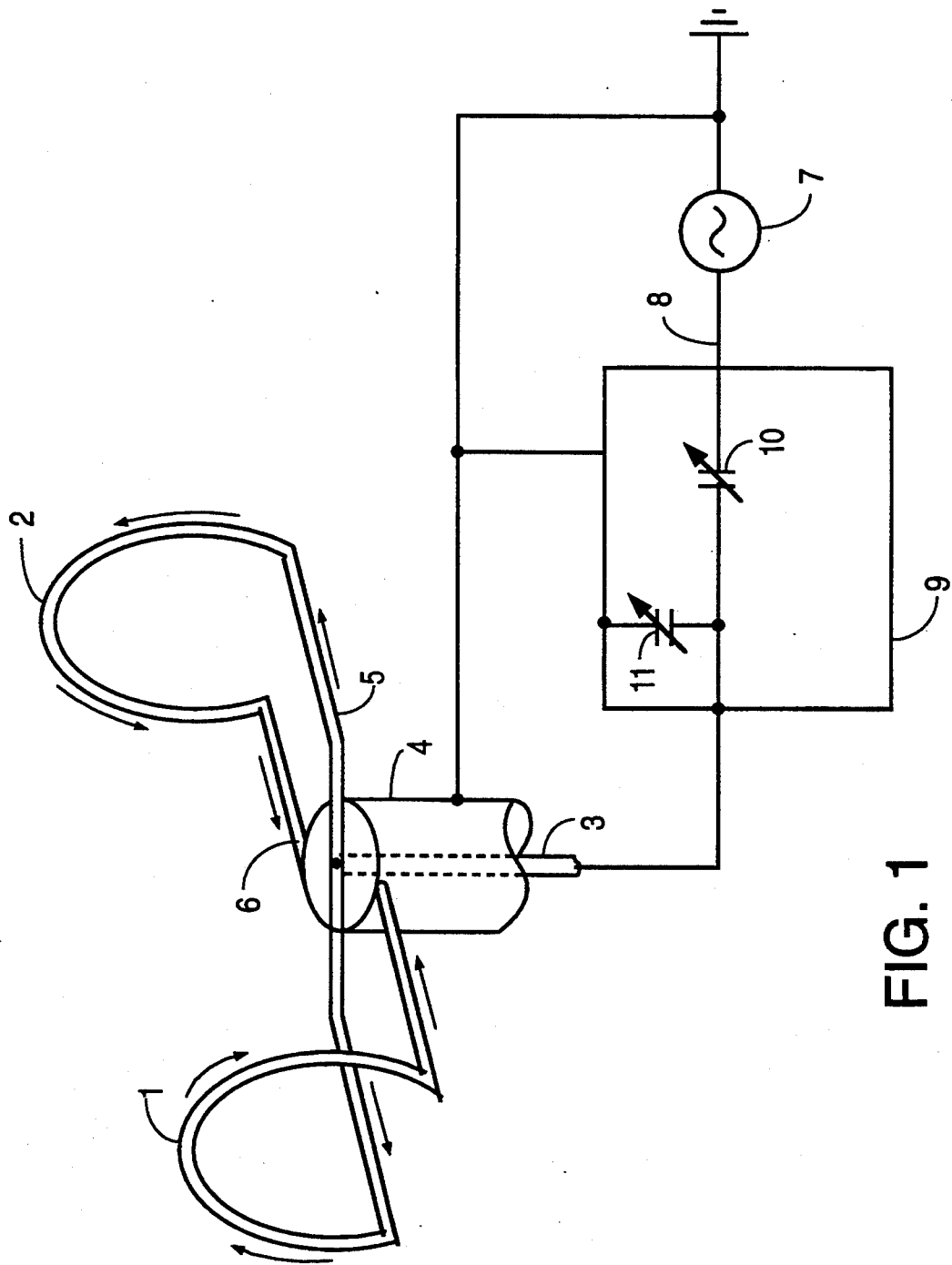
FIG. 1 is a schematic diagram depicting the principle of operation and RF current flow in an antenna constructed according to the invention as shown in U.S. Pat. No. 4,990,229.
Figure 2A:
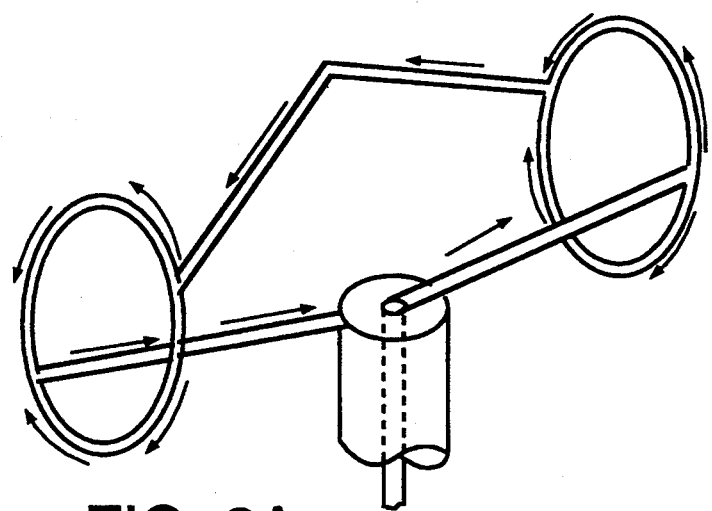
FIGS. 2A, 2B and 2C are schematic views of antennas constructed according to the principles of the invention.
Figure 2B:
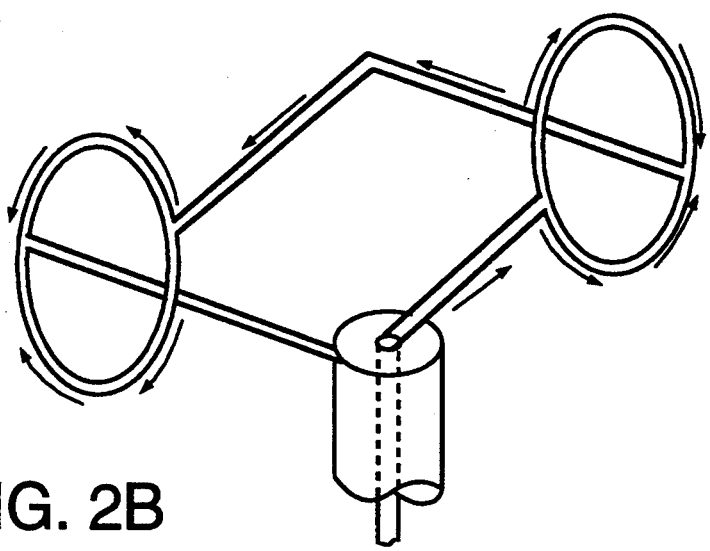
Figure 2C:
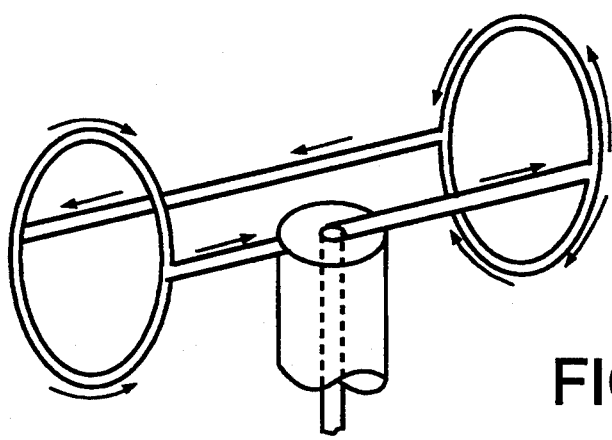
Figure 14A:
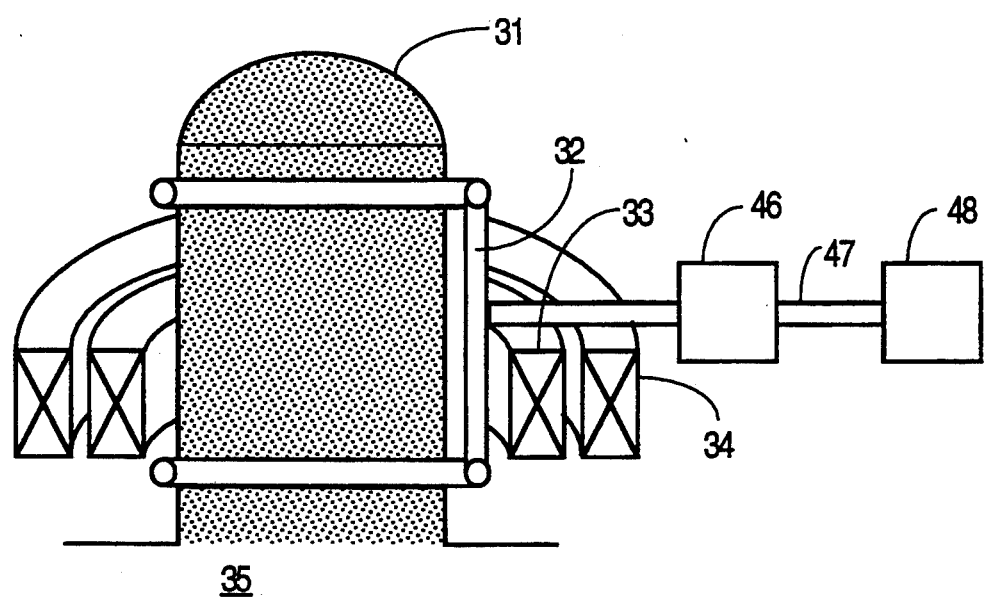
FIGS. 14A to 14C are diagrams showing the arrangement of the electromagnetic system in the plasma generator region according to the present invention to make efficient the transport of plasma from the plasma generator tube to the substrate process chamber which includes a magnetic bucket and where uniformity and high plasma flux to the substrate are required.
Figure 14B:
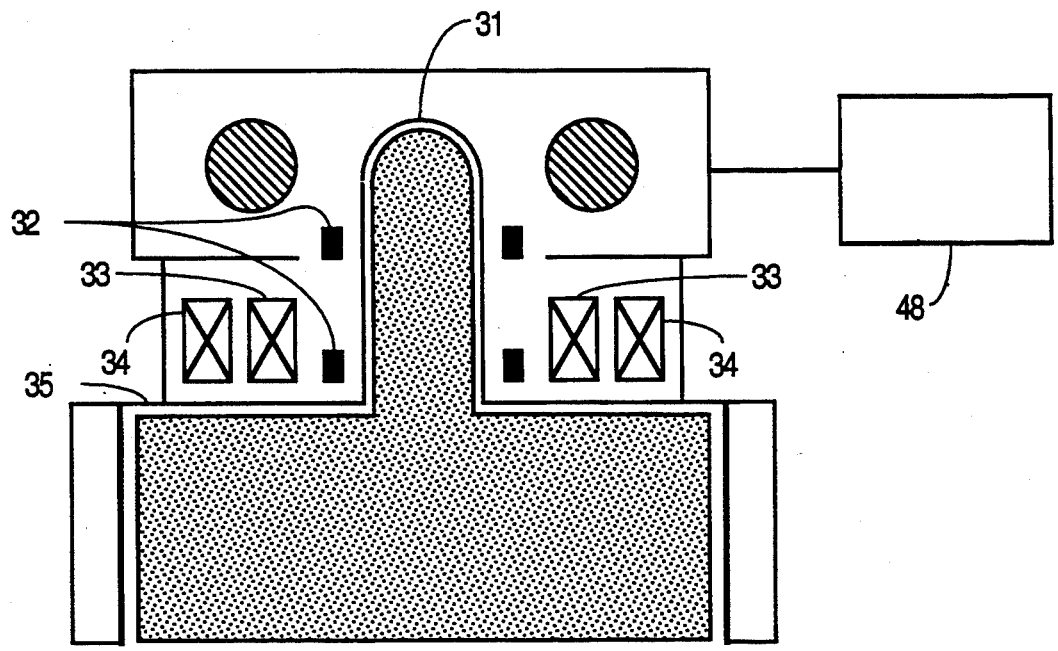
Figure 14C:
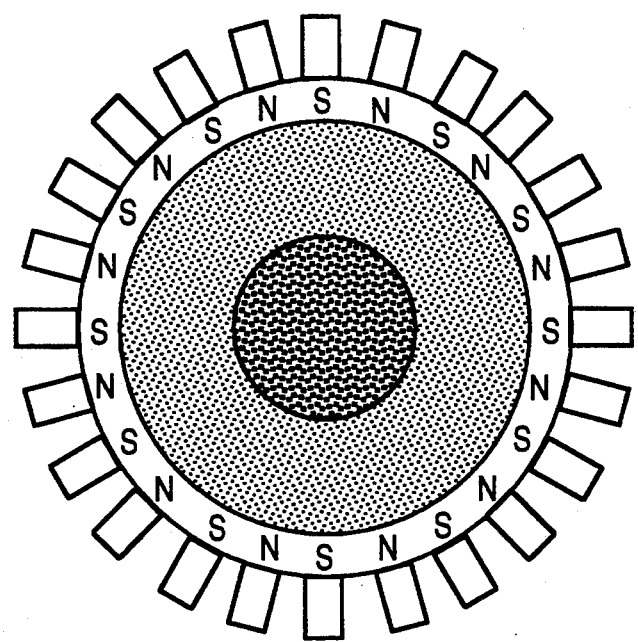

As discussed, the invention relies on the use of a double set of magnet coils 33 and 34 with an inner magnet coil 33 of smaller diameter and an outer magnet coil 34 of larger diameter located around the inner magnet coil 33 in order to produce the magnetic field for use with an RF plasma generator described in U.S. Pat. Nos. 4,990,229 and 5,122,251 in order to transfer plasma more efficiently from the plasma generator tube 31 to the substrate 38 that is located in the substrate processing chamber 35 of FIG. 16A. The principle types of antenna 32 used to generate plasma in the plasma generator tube 31 are shown in FIGS. 1, 2, and 3. The substrate processing chamber 35 is surrounded by a multipolar set of permanent magnets 207, shown in FIG. 16B, with generally either 20 or 24 magnets of alternating polarity (called a magnetic bucket) and designed as described in U.S. Pat. Nos. 4,990,229 and 5,122,251 in general accordance with the principles given by Limpaecher and MacKenzie (in Rev. Sci. Instrum. Vol. 44,726 (1973)). The distance between the end of the plasma generator tube 31 and the substrate 219 is typically 160 mm at the maximum or less, without sacrificing plasma uniformity or intensity. The plasma uniformity is generally less than 2% (1 sigma) at the substrate location. The distance between the end of the plasma generator tube 31 and the substrate 219 is generally between 10 cm and 20 cm and can be adjusted to achieve a required uniformity by adjusting the current in the outer magnet coil 34 relative to the amount of current to the inner magnet coil 33 shown in FIG. 16A and FIGS. 14A and 14B. An earlier and common design involves using only one magnet 33 in the schematic arrangement shown in FIG. 4A.

Figure 15A:
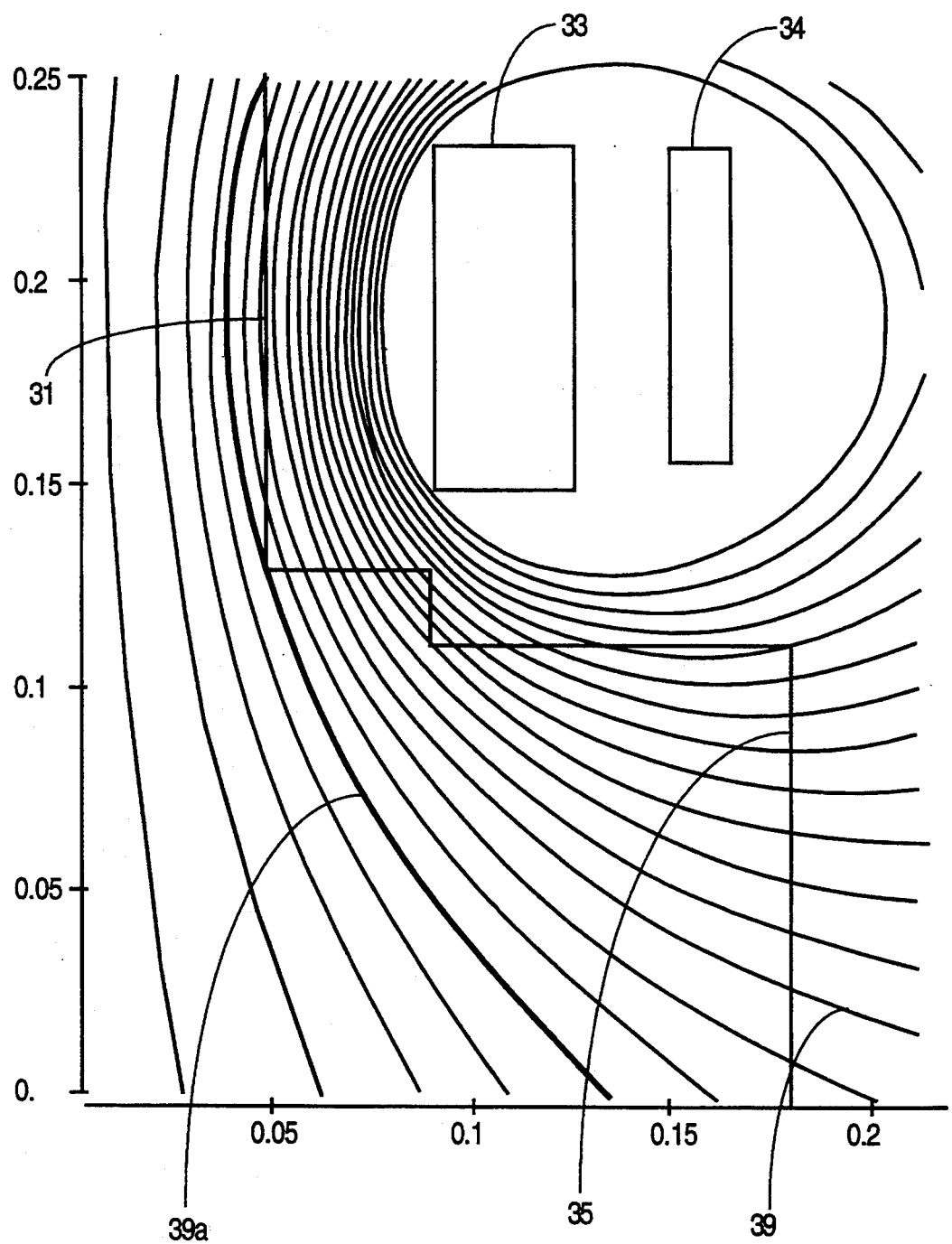
FIG. 15A is a plot of the magnetic field lines obtained using one electromagnet surrounding the plasma source tube.
Figure 15B:
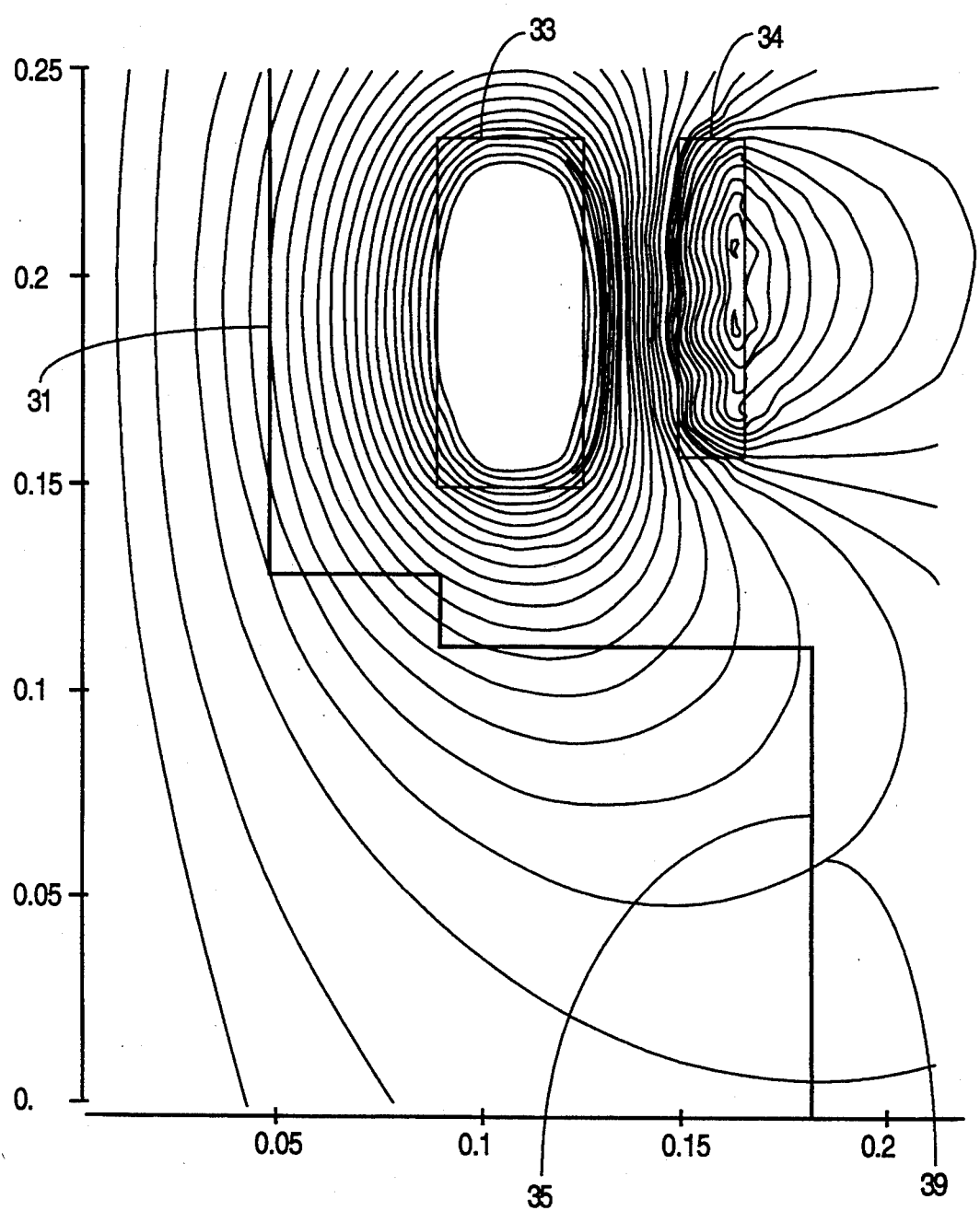
FIG. 15B is a plot of the magnetic field lines obtained using two electromagnets surrounding the source tube and where the outer magnet coil carries a current in the opposite direction from the inner magnet coil and has a coil current that is 40% as large in magnitude as that of the inner coil.

The graphs of magnetic field shown in FIG. 15A and FIG. 15B demonstrate the efficiency of the double coil arrangement. FIG. 15A shows the magnetic field pattern which results from 100A of current flowing only in the inner magnet coil 33 of FIGS. 14A and 14B. The lines 39 of magnetic field are shown to extend well below the plasma source tube and into the process chamber region below. Magnetic field line 39a is the first magnetic field line 39 to intersect the wall of plasma generator tube 31. These magnetic field lines 39 curve more rapidly in FIG. 15B towards the side walls once leaving the source tube region. In this case, there is 100A of current flowing in the inner magnet coil 33 and 60A of current flowing in the outer magnet coil 34 and in a direction opposite to the current flowing in the inner magnet coil 33. This clearly demonstrates the more efficient transport of magnetic flux to the process chamber region and the more rapid decrease of magnetic field strength as one moves down along the central axis from the source tube region into the process chamber region. As a result, when combined with the magnetic field effects of the multipolar bucket surrounding the process chamber, a highly efficient transport of plasma occurs while maintaining high plasma uniformity and less than 5 Gauss magnetic field at the wafer substrate location in the process chamber.

Another objective of this invention is to provide a means to inject gas into the substrate process chamber 35 (best shown in FIG. 14B) so as to eliminate the need for a separate gas feed system such as a gas feed ring and to minimize particle formation in the substrate process chamber 35 by eliminating extra surfaces in the substrate process chamber 35 and by permitting the inside of the substrate process chamber 35 to be smooth and without corners. The main housing of the substrate process chamber 35 is a single piece of aluminum in the shape of a cylinder that has sides, an open bottom and a top containing a hole about the cylinder axis which serves as the exit hole and interface with the plasma generator tube 31. The plasma generator tube 31 is preferably made of quartz or alumina and attaches to the top of the substrate process chamber 35. The substrate process chamber walls are preferably about 250 mm in thickness. Holes in the form of tubes 171 are created in the top cover of the cylinder approximately 150 mm below the top of the cylinder and in a plane perpendicular to the axis of the cylinder. The interior of the tubes 171 is anodized. A preferred form of these gas feed lines is a diamond pattern shown in FIG. 17A in which each tube cutout 171 is approximately tangent to a circumference of a circle whose radius is equal to the substrate radius. Gas outlet nozzles are inserted into tap holes 172 drilled into the top plate so as to connect to the gas feed lines 171 in the top section of the substrate process chamber. The nozzle pieces are removable for cleaning and have smooth external surfaces to minimize particulate formation. Gas is fed from one or more feed sites into the tube lines 171 in the top of the single piece cylindrical substrate process chamber to permit control of the pressure in the tube lines 171 and the gas release rate from each nozzle regardless of wafer size. For 8 inch wafers, gas is preferably fed at one entrance hole in the top of the cylindrical substrate process chamber and four nozzles are used to release the gas uniformly towards the substrate. Excellent rates and uniformity are achieved and separate gas feed 41 into the plasma generator tube 31 is not required for most etch process applications. For deposition applications, a primary reactive gas is fed through the tubes or through a separate gas ring into the substrate process chamber and a second and usually less complex gas such as argon, helium, nitrogen, or oxygen is fed through the gas feed 41 directly into the plasma generator tube 31.

Figure 17A:
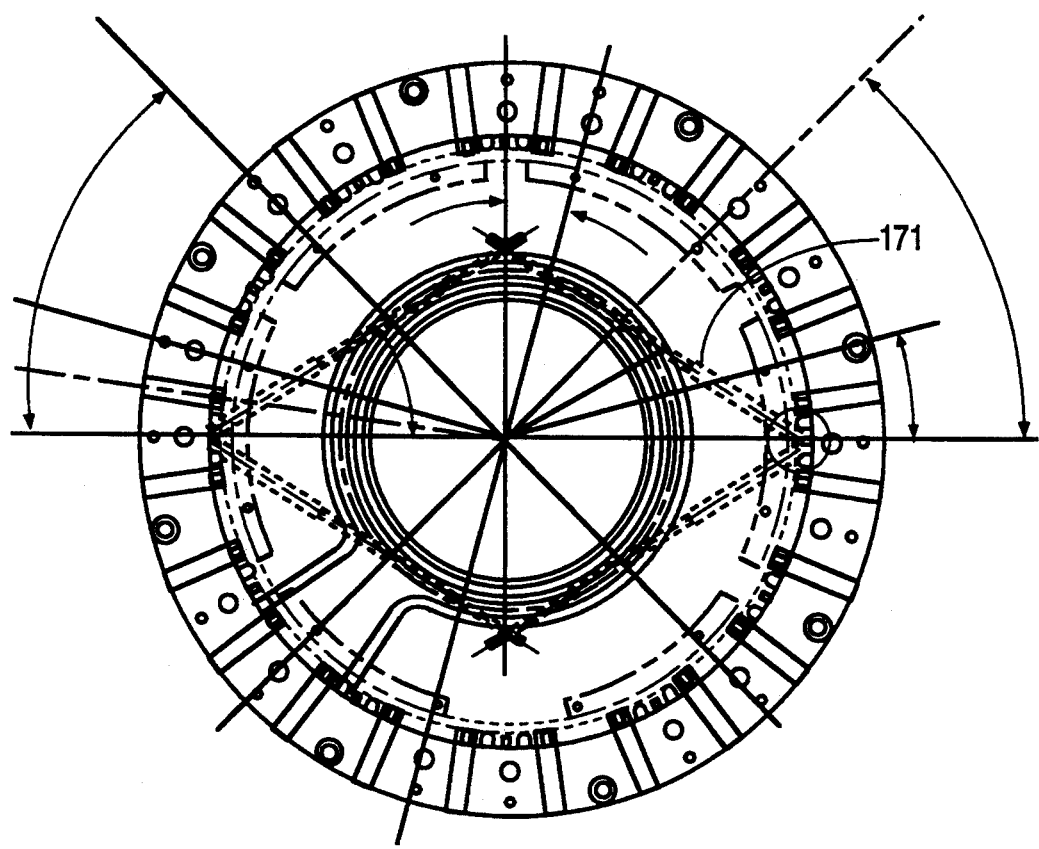
FIG. 17A is a plan view of the substrate process chamber showing the gas feed lines, the nozzle holes for gas injection into the chamber, the water cooling lines and the grooves for the ceramic permanent magnets.
Figure 17B:
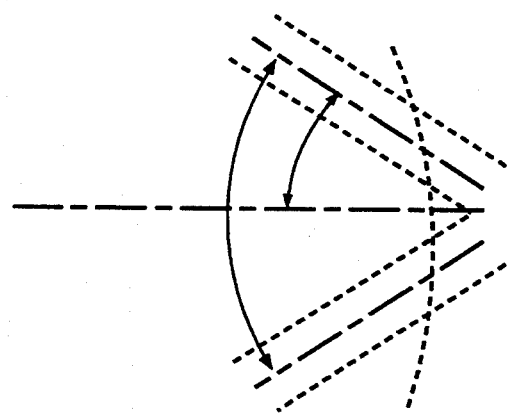
FIG. 17B is a detail showing the entrance to the gas feed line at the top of the substrate process chamber shown in FIG. 17A.
Figure 17C:
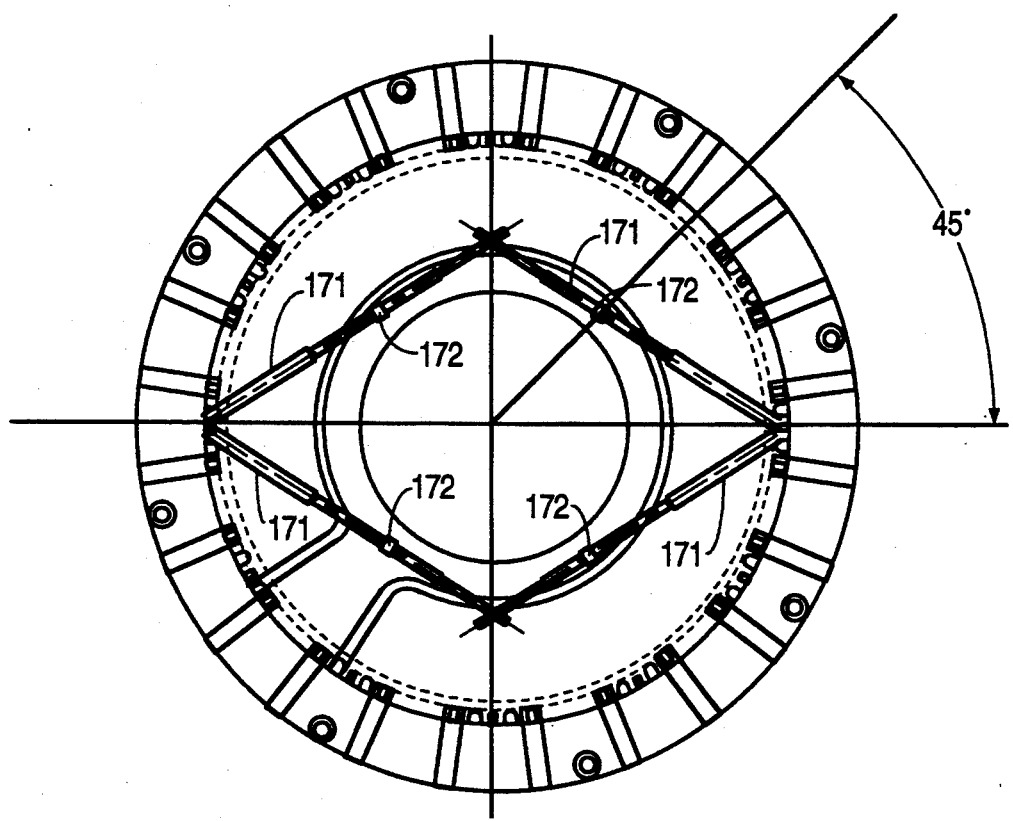
FIG. 17C shows in larger size the gas feed structure of FIG. 17A.

Highly uniform etching of polysilicon and metal films such as aluminum and tungsten has been demonstrated with the system shown in FIG. 16A and FIG. 17A and described here. The double coil arrangement around the plasma generator tube 31 and the gas feed system described here are key to achieving excellent results. In particular, extensive study has shown that when etching polysilicon or aluminum films, highly uniform and anisotropic etching is achieved when the ratio of the current in the outer magnet coil 34 to the current flowing in the inner magnet coil 33 is in the range from 1.0 to 2.5, and where the currents flowing in each coil are oppositely directed. Preferred ratios are between 1.5 and 2.2 depending on the pressure of chlorine which is preferably in the range 1.0 to 3.0 mtorr.

Figure 18:
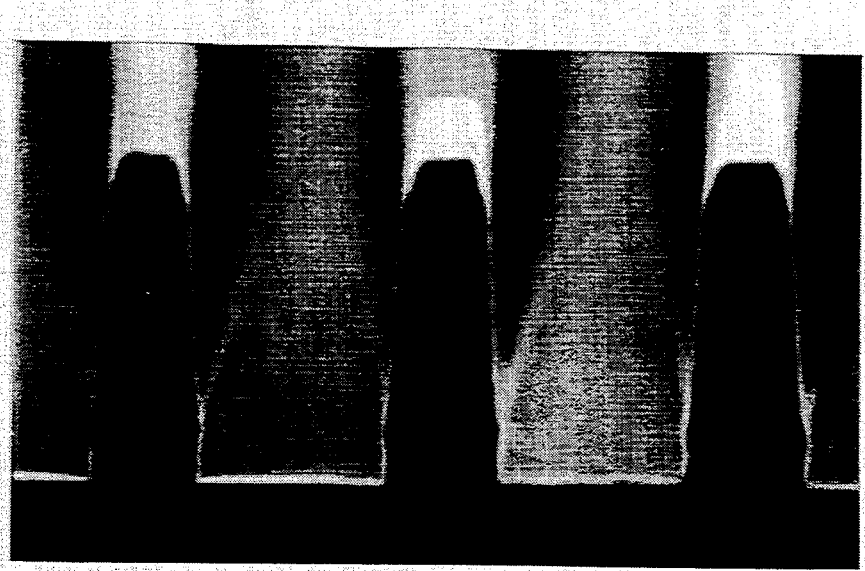
FIG. 18 is a cross sectional SEM image obtained for the etching of poly-Si in pure $Cl_2$ using the MORI plasma source etching system. In this case, the SEM shows structure with 100% overetch. One sees highly anisotropic profiles, no notching, and less than 50 Å oxide loss.

An example result is shown in FIG. 18 which is a scanning electron microscope image of a doped and patterned polysilicon wafer consisting of photoresist on a 4000 Å polysilicon layer over a 1000 Å thermal oxide film. The feature size is 0.4 microns. The etching process in chlorine is at 2.3 mtorr and consists of three steps: a 20 second punchthrough; a 40 second main etch with a source power of 3 KW and a wafer bias power of 38 W; and a 100% overetch step at a source power of 1 KW and a wafer bias power of 20 W. The poly-Si etch rate is 3170 Å/m, the selectivity to oxide is about 90 and the selectivity to photoresist exceeds 10. No notching is observable and there is less than 50 Å oxide loss. For POCL-doped wafers, similar selectivity and anisotropy results are achieved at poly-Si etch rates of 3970 Å/m at a uniformity of about 2% (1 sigma).

Of course, specific results depend on a variety of factors including the particular characteristics of a wafer. The results reported here show that the etching of poly-Si using a MORI RF plasma source etching system yields high etch rates (2500 to 4000 Å/m), high selectivity to oxide (generally around 100) and to photoresist (generally exceeding 10), high uniformity (generally less than 2% (1 sigma)) and high anisotropy.

The etching of the metal film Al—Si—0.5 Cu by pure $Cl_2$ and $Cl_2$—$BCl_3$ mixtures in this plasma source etching system has also been carried out using patterned wafers with 1 micron feature size and consisting of photoresist on a 10,000 Å Al film over a 1000 Å thermal oxide layer. Uniform etching at rates ranging from 5000

Figure 19:
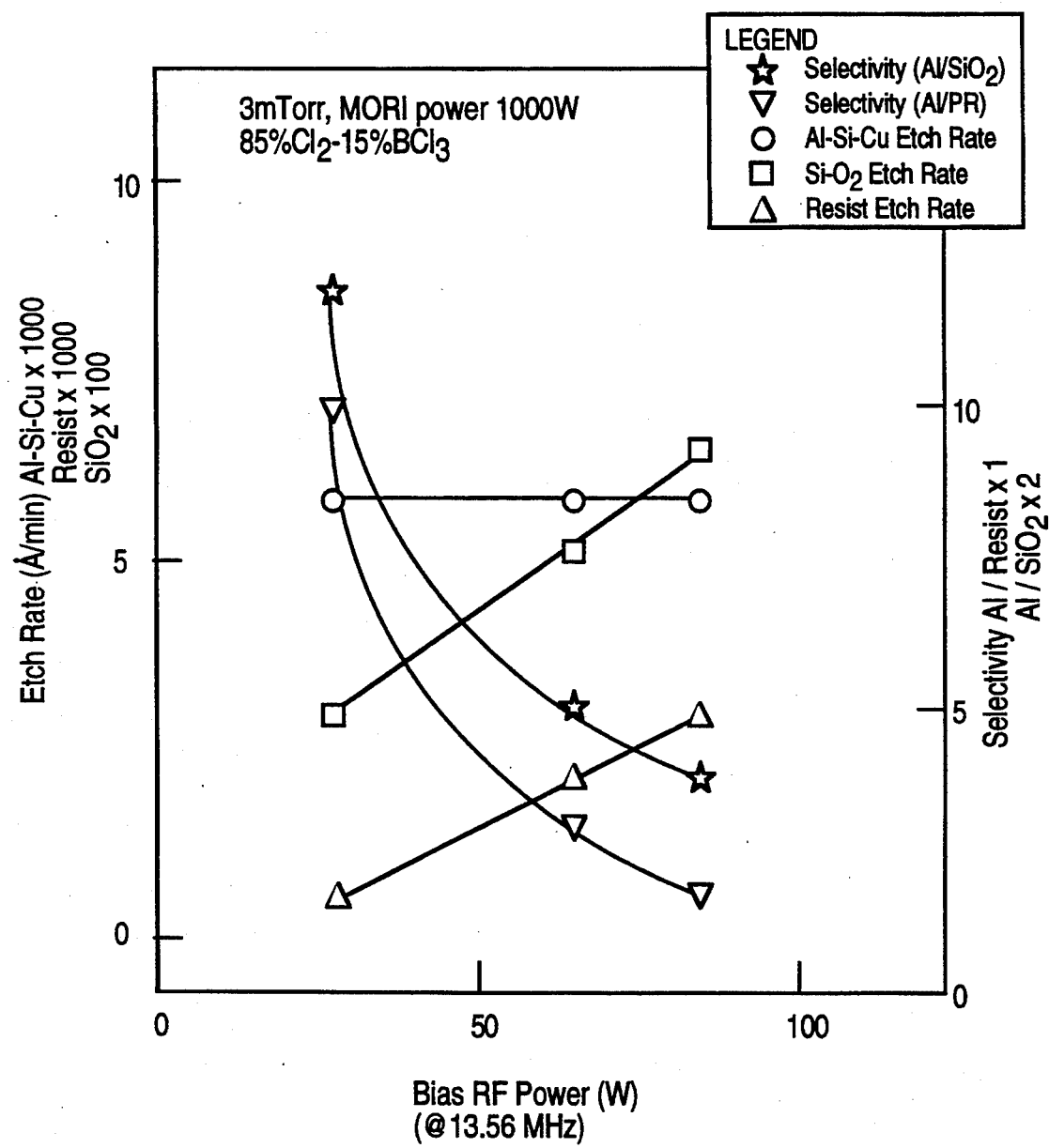
FIG. 19 shows the aluminum etch rate, the oxide etch rate, and the PR etch rate (left ordinate) and selectivity to photoresist etching and to oxide etching (right ordinate) as a function of RF wafer bias power applied at 13.56 MHz. The gas mixture is 85% $Cl_2$–15% $BCl_3$, the MORI source power is 1 KW, and the substrate is located in the process chamber 20 cm below the end of the source tube.

Å/m to 12,000 Å/m are achieved. Results at 3 mtorr in an 85% $Cl_2$—15% $BCl_3$ mixture using 1 KW of source power are shown in FIG. 19 as a function of RF bias power applied to the wafer. The Al film etch rate is essentially independent of bias power, but the selectivity to oxide and to photoresist increase sharply with decreasing bias power. Thus, at 30 W of RF bias power, the Al etch rate is about 6500 Å/m while the selectivity values are very high: 22 to 1 for selectivity to oxide etching and 9 to 1 for selectivity to photoresist etching. In general, the etch rate increases with source power, $BCl_3$ addition, and gas pressure. The selectivity increases with decreasing bias power while good, anisotropic etching is achievable in both pure $Cl_2$ and $Cl_2$—$BCl_3$ gases.

Preferred operating condition and source-coil currents can depend on working gas, source power, wafer bias power, and gas pressure. For example, in the etching of tungsten using fluorine-containing gases such as $SF_6$, it is found that the optimum outer magnet coil 34 to inner magnet coil 33 current ratio is closer to 1 for etching at a pressure of about 3 mtorr.

Figure 20:
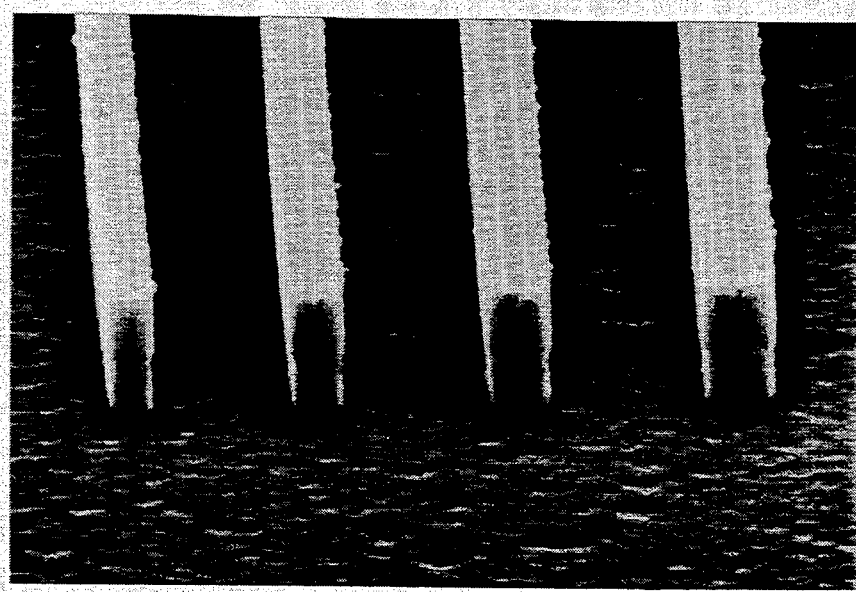
FIG. 20 is a cross sectional SEM image obtained for sub micron etching of W on a TiW adhesion layer on thermal oxide in pure $SF_6$ using the MORI plasma source etching system. The anisotropy is excellent, there is no CD loss, and there are no residues.

Specifically, patterned tungsten wafers were etched in the plasma source etching system using pure $SF_6$. The wafers used had a dry-developed photoresist over a 5500 Å W layer over a 500 Å TiW layer on a 1000 Å thermal oxide layer. The feature size varies from 0.27 micron to about 1 micron. Both a one-step and two-step process have been investigated. In the one-step process at 3 mtorr, the source power is 1 KW and the wafer bias power is 50 W. In the two-step process at 3 mtorr, the source power is 1.5 KW but the wafer bias power is first 25 W and then 65 W. A uniform, anisotropic etch of W over TiW is achieved along with very good etch rates and high values of selectivity to both photoresist and oxide. For the one-step process using pure $SF_6$ gas at 3 mtorr, the etch rate is 2770 Å/m. The preferred process is a two-step process with the bias power in the second step reduced to 50 W to yield an etch rate of 2770 Å/m with a selectivity value greater than 2 for W to PR and greater than 10 for W to oxide. The etching is highly anisotropic with minimal CD loss and no residues as illustrated by the SEM shown in FIG. 20.

Table 1 illustrates a number of different uses of the plasma deposition or etching apparatus of this invention when used to etch a substrate. Table 1 lists various combinations of gases to be fed into the source region of the plasma generation apparatus corresponding to plasma source 31 in FIG. 16A and into the process chamber region corresponding to substrate process chamber 35 in FIG. 16A. Pure chlorine provides a preferred gas for use in etching at 1.5 to 2 mtorr in the structure of FIG. 16A. However, as shown in Table 1, a number of different gases are suitable for use in the apparatus of this invention when used to etch selected materials of a type commonly used in the fabrication of semiconductor devices. However, it should be noted that the apparatus of this invention is suitable for use for any of a variety of purposes, including the etching of metals and other materials suitable for use in numerous applications.

Referring to Table 1, when silicon dioxide is etched, the preferred gases for use in the apparatus of this invention are freon and methane. When used for metal etching, an optimum gas is chlorine ($Cl_2$) at 90–95% volume and boron trichloride ($BCl_3$) at 5–10% and at a pressure of 2 to 3 mtorr.

Table 2 gives a number of different gases or combinations of gases to be fed into plasma generator tube 31 in FIG. 16A and a number of different gases or combinations of gases to be fed into substrate process chamber 35 shown in FIG. 16A. The particular film to be deposited is illustrated in the leftmost column and the gases to be used in both plasma generator tube 31 and substrate process chamber 35 are listed in the second and third columns.

While the invention has been described relative to a number of forms and variations, it will be appreciated that the invention is not limited thereto, but encompasses all modifications in accordance with the scope of the appended claims.

TABLE 1

Etching
(Operating Pressure Range; 0.5 to 10 mtorr)
(Optimum Pressure Range; 1–3 mtorr)

| Etching Substrate | Gas or Combination of Gases Fed into Source Region 1 | | Gas or Combination of Gases Fed into Process Chamber Region 2 or 3 |
|---|---|---|---|
| 1. Etching of Polysilicon | | | |
| A. Doped Polysilicon Gate Etch | $Cl_2$; $SF_6$, $CF_4$; $Cl_2+O_2$; $SF_6+O_2$; or $CF_4+O_2$; plus He | and/or | $Cl_2$; $SF_6$; $CF_4$; $Cl_2+O_2$; $SF_6+O_2$; $CF_4+O_2$; He |
| B. Undoped Polysilicon Gate Etch | $Cl_2$; $SF_6$, $CF_4$; $Cl_2+O_2$; $SF_6+O_2$; or $CF_4+O_2$; plus He | and/or | $Cl_2$; $SF_6$; $CF_4$; $Cl_2+O_2$; $SF_6+O_2$; $CF_4+O_2$; He |
| C. Polysilicon Buffer Layer Etching (PBL) | $Cl_2$; $SF_6$, $CF_4$; $Cl_2+O_2$; $SF_6+O_2$; or $CF_4+O_2$; plus He | and/or | $Cl_2$; $SF_6$; $CF_4$; $Cl_2+O_2$; $SF_6+O_2$; $CF_4+O_2$; He |
| D. Spacer Etching (Etch of Lightly Doped Drains or LDD) | $Cl_2$; $SF_6$, $CF_4$; $Cl_2+O_2$; $SF_6+O_2$; or $CF_4+O_2$; plus He | and/or | $Cl_2$; $SF_6$; $CF_4$; $Cl_2+O_2$; $SF_6+O_2$; $CF_4+O_2$; He |
| 2. Etching Silicon Nitride ($Si_3N_4$) | | | |
| A. Etching of Plasma-deposited $Si_3N_4$ Pads | $SF_6$; $CF_4$; $O_2$; $CHF_3$; $SF_6+O_2$; $CF_4+O_2$; or $CHF_3+O_2$; plus He | and/or | $SF_6$, $CF_4$, $O_2$, $CHF_3$, $SF_6+O_2$, $CF_4+O_2$, or |

TABLE 1-continued

Etching
(Operating Pressure Range; 0.5 to 10 mtorr)
(Optimum Pressure Range; 1-3 mtorr)

| | Etching Substrate | Gas or Combination of Gases Fed into Source Region 1 | | Gas or Combination of Gases Fed into Process Chamber Region 2 or 3 |
|---|---|---|---|---|
| B. | Etching of LDD Structures (LPCVD Nitride) | $SF_6$; $CF_4$; $O_2$; $CHF_3$; $SF_6+O_2$; $CF_4+O_2$; or $CHF_3+O_2$; plus He | and/or | $CHF_3+O_2$, plus He $SF_6$, $CF_4$, $O_2$, $CHF_3$, $SF_6+O_2$, $CF_4+O_2$, or $CHF_3+O_2$, plus He |
| C. | Etching or Nitride Spacer | $SF_6$; $CF_4$; $O_2$; $CHF_3$; $SF_6+O_2$; $CF_4+O_2$; or $CHF_3+O_2$; plus He | and/or | $SF_6$, $CF_4$, $O_2$, $CHF_3$, $SF_6+O_2$, $CF_4+O_2$, or $CHF_3+O_2$, plus He |
| 3. | Etching of Silicon Dioxide ($SiO_2$) | | | |
| A. | Etch Thermal Oxide | $CF_4$, $CHF_3$, $C_2F_6$, $O_2$, $SF_6$, $SF_6+C_2F_6$, $CHF_3+C_2F_6$, $SF_6+C_3F_8$, or $CHF_3+O_2$ plus He | and/or | $CF_4$, $CHF_3$, $C_2F_6$, $O_2$, $SF_6$, $SF_6+C_2F_6$, $CHF_3+C_2F_6$, $SF_6+C_3F_8$, or $CFH_3+O_2$ plus He |
| B. | Etching of Phosphosilicate Glass (PPG) or Borophosphosilicate Glass (BPSG) | $CF_4$, $CHF_3$, $C_2F_6$, $O_2$, $SF_6$, $SF_6+C_2F_6$, $CHF_3+C_2F_6$, $SF_6+C_3F_8$, or $CHF_3+O_2$ plus He | and/or | $CF_4$, $CHF_3$, $C_2F_6$, $O_2$, $SF_6$, $SF_6+C_2F_6$, $CHF_3+C_2F_6$, $SF_6+C_3F_8$, or $CFH_3+O_2$ plus He |
| C. | Sputter Etching of $SiO_2$ | Ar or He, $N_2$ | and/or | $CF_4$, $CHF_3$, $C_2F_6$, $O_2$, $SF_6$, $SF_6+C_2F_6$, $CHF_3+C_2F_6$, $SF_6+C_3F_8$, or $CHF_3+O_2$ plus He |
| 4. | Metal Etching | | | |
| A. | Etching of Al—Si(0-2%) (Optimum Pressure (1-3 mtorr)) | $Cl_2$; $BCl_3$; $Cl_2+BCl_3$; $SiCl_4$, HBr, $N_2$, $Cl_2+N_2+BCl_3$, $SCl_4+N_2+BCl_3+Cl_2$, $BCl_3+Cl_2$; or $BCl_3+Cl_2+N_2$, plus He | and/or | $Cl_2$, $BCl_3$, $SiCl_4$, HBr, $N_2$, $Cl_2+N_2+BCl_3$, $SCl_4+N_2+BCl_3+Cl_2$, $BCl_3+Cl_2$, or $BCl_3+Cl_2+N_2$, plus He |
| B. | Etching of Al—Si(0-2%)-Cu(0-3%) Optimum Pressure (1-3 mtorr)) | $Cl_2$; $BCl_3$; $Cl_2+BCl_3$; $SiCl_4$, HBr, $N_2$, $Cl_2+N_2+BCl_3$, $SCl_4+N_2+BCl_3+Cl_2$, $BCl_3+Cl_2$; or $BCl_3+Cl_2+N_2$, plus He | and/or | $Cl_2$, $BCl_3$, $SiCl_4$, HBr, $N_2$, $Cl_2+N_2+BCl_3$, $SCl_4+N_2+BCl_3+Cl_2$, $BCl_3+Cl_2$, or $BCl_3+Cl_2+N_2$, plus He |
| 5. | Etching of Barrier Metals | | | |
| A. | Etching of TiW, TiN, Si, and Mo | $Cl_2$; $BCl_3$; $Cl_2+BCl_3$; $SiCl_4$, HBr, $N_2$, $Cl_2+N_2+BCl_3$, $SCl_4+N_2+BCl_3+Cl_2$, $BCl_3+Cl_2$; or $BCl_3+Cl_2+N_2$, plus He plus options of $CF_4$ or $SF_6$ | and/or | $Cl_2$, $BCl_3$, $SiCl_4$, HBr, $N_2$, $Cl_2+N_2+BCl_3$, $SCl_4+N_2+BCl_3+Cl_2$, $BCl_3+Cl_2$, or $BCl_3+Cl_2+N_2$, plus He + $CF_4$ or $SF_6$ |
| B. | Etching Metallic Silicides | $SF_6$, $CF_4$, $O_2$, $CHF_3$, $SF_6+He$, $SF_6+O_2$ or $CF_4+O_2$, plus He | and/or | $SF_6$, $CF_4$, $O_2$, $CHF_3$, $SF_6HE$, $SF_6+O_2$ or $CF_4+O_2$, plus He |
| 6. | Etching Polyimide | $O_2$, $CF_4$, or $CF_4+O_2$, plus He | and/or | $O_2$, $CF_4$, or $CF_4+O_2$, plus He |
| 7. | Etching Blanket Tunsten | $SF_6$, $CF_4$, $O_2$, $SF_6+O_2$, $CF_4+O_2$, $SF_6+He$ or $CF_4+He$, plus He | and/or | $SF_6$, $CF_4$, $O_2$, $SF_6+O_2$, $CF_4+O_2$, $SF_6+He$ or $CF_4+He$, plus He |
| 8. | Etching Copper | $Cl_2+N_2$ or $SiCl_4+N_2$, plus He | and/or | $Cl_2+N_2$ or $SiCl_4+N_2$, plus He |

TABLE 2

Deposition of Films
(Operating Pressure Range; 5–30 mtorr)

| Deposition Film | Gas or Combination of Gases Fed into Source Region 1 | | Gas or Combination of Gases Fed into Process Chamber Region 2 or 3 |
| --- | --- | --- | --- |
| 1. Deposition of $SiO_2$ | $O_2$, $H_2O$, NO, or $SiH_4+N_2O$ plus Ar or He | and/or | $SiCl_4$, $SiH_4$, $SiCl_2H_2$, $Si_2H_6$, or $Si_3H_8$ |
| 2. Deposition of $Al_2O_3$ | $H_2O$ or $O_2$ plus Ar or He | and/or | $AlCl_2$ or $Al(CH_2)_3$ |
| 3. Deposition of $TiO_2$ | $O_2$ or $CO_2$ | and/or | $TiCl_4$ |
| 4. Deposition of $Ti_2O_3$ | $O_2$ | and/or | Ti isopropylate |
| 5. Deposition of SiON | $N_2$, $NH_3$, $O_2$, $N_2O$, $H_2$, or NO plus He or Ar | and/or | $Si_2H_5$, $SiBr_4$, $SiCl_4$, $SiH_4$, or $SiCl_2H_2$ |
| 6. Deposition of Alumininum | He or Ar | and/or | $AlCl_3$, $Al(CH_3)_3$, or $Al(C_4H_2)_2$ |
| 7. Deposition of Molybdenum | He or Ar, $N_2$ | and/or | $Mo(Co)_6$, $MOCl_5$ or MoFe |
| 8. Deposition of Tungsten | He or Ar, $N_2$ | and/or | $WF_6$ or $WCl_6$ |
| 9. Deposition of Carbon and a-C | $H_2$ | and/or | $CH_4$, $C_2H_2$, $C_4H_{10}$ |
| 10. Deposition of AlN | $N_2$, $NH_3$, $N_2O$, or $N_2O$ plus He or Ar | and/or | $AlCl_3$, $Al(CH_3)_3$ |
| 11. Deposition of SiN | $NH_3$, $N_2$ or $H_2$ plus Ar, He | and/or | $SiCl_4$, $SiH_4$, $Si_2H_6$ $Si_3H_8$, $SiCl_2H_2$ |
| 12. Deposition of Boron nitride (BN) | $N_2$ or $NH_3$ plus He or Ar | and/or | $B_2H_6BBr_3$, $B(OC_2H_5)_3$ |
| 13. Deposition of Titanium carbide (TiC) | $CH_4$ or $C_2H_2$ plus He or Ar | and/or | $TiCl_4Ti$ isopropylate |
| 14. Deposition of SiC | $H_2$, He or Ar | and/or | $SiH_4$, $CH_2$, $C_2H_2$, $CH_4$, $Si(CH_3)_2H_4$ $Si_2H_6$ |
| 15. Deposition of TiSi | H, Ar or He | and/or | $TiCl_4$ and $SiH_4$ or $Si_3H_6$ or $Si_3H_8$ or $SiCl_2H_2$ Ti isopropylate |
| 16. Deposition of $MoSi_2$ | He or Ar | and/or | $Mo(Co)_6$, $MoCl_5$ or MoFe, and $SiH_4$, $Si_2H_6$, $Si_3H_8$ or $SiCl_2H_2$ |
| 17. Deposition of $WSi_2$ | He or Ar | and/or | $WF_6$ or $WCl_6$ and $SiH_4$, $Si_2H_6$, $SiCl_2H_2$ or $Si_3H_8$ |
| 18. Deposition of $TaSi_2$ | He or Ar | and/or | $TaCl_4$ and $SiH_4$, $Si_2H_6$, $SiCl_2H_2$, or $Si_3H_8$ |
| 19. Deposition of a-Si | $H_2$, Ar or He or $N_2$ (drop temp to 580° C.) | and/or | $SiH_4$, $Si_2H_6$, $SiCl_2H_2$ or $Si_3H_8$ |
| 20. Deposition of Polysilicon | $H_2$ plus Ar or He | and/or | $Si_2H_6$, $Si_3H_8$, $SiCl_2H_2$ or $SiH_4$ |

What is claimed is:

1. Structure for use in generating a high density plasma for processing of a substrate, said structure comprising:
    a plasma generation chamber;
    an inner coil encompassing a portion of said plasma generation chamber;
    an outer coil encompassing a portion of said inner coil, said outer coil being substantially coplanar with said inner coil;
    a collar which holds said inner and outer coils at positions fixed relative to each other and which prevents relative movement of the coils; and
    a circuit for adjusting relative amounts of current in said inner and outer coils.

2. Structure as in claim 1, further comprising a substrate process chamber for holding a workpiece to be operated upon by plasma generated in said plasma generation chamber, wherein said plasma generation chamber, said inner coil, and said outer coil are mounted on said substrate process chamber.

3. Structure as in claim 2, wherein said substrate process chamber comprises a top plate, and said top plate includes tubes and tap holes for feeding gas into said substrate process chamber.

4. The structure of claim 3, wherein said tubes in said top plate form a diamond pattern.

5. The structure of claim 4, wherein said tap holes extend from an interior surface of said substrate process chamber to said tubes in said top plate and said tap holes are located at points on a circumference of a circle with a radius equal to a radius of the workpiece being processed.

6. The structure of claim 1, wherein said circuit for adjusting amounts of current further comprises structure for producing a current of a first direction in said first coil and current of a second direction opposite to said first direction in said second coil.

7. The structure of claim 1, wherein said inner and outer coils have a common axis, and said inner coil has a height along said axis that is substantially equal to a height of said outer coil along said axis.

8. An apparatus for producing a plasma for use in processing a substrate, comprising:
    a plasma generation chamber;
    a fluid injector for introducing a fluid into the plasma generation chamber, thereby permitting the creation of a plasma within the plasma generation chamber;
    a first magnetic coil for generating a magnetic field, the first magnetic coil being located around the plasma generation chamber; and
    a process chamber in which the substrate is disposed, the process chamber having a top, the top having a hole therethrough, a feed line formed therein, and a tap hole connecting the feed line to a volume enclosed by the process chamber, wherein the plasma generation chamber is attached to the top of the process chamber so that the magnetic field transports the plasma formed in the plasma generation chamber through the hole, into the process chamber, and the tap hole introduces a fluid into the process chamber.

9. An apparatus as in claim 8, further comprising a second magnetic coil, wherein the first and second magnetic coils have fixed relative positions and are disposed in a substantially coplanar relationship such that the first magnetic coil lies within the second magnetic coil.

10. An apparatus as in claim 8, further comprising:
    a second magnetic coil located around the plasma generation chamber; and
    structure for producing a current of a first direction in the first coil and current of a second direction opposite to the first direction in the second coil.

11. An apparatus as in claim 8, wherein the substrate is a semiconductor wafer.

12. An apparatus as in claim 8, wherein the top of the process chamber further comprises second, third, and fourth feed lines which together with the first-mentioned feed line form a diamond pattern with each feed line being approximately tangent to a circumference of a circle whose radius is equal to the radius of the substrate being processed.

13. The structure of claim 12, wherein the tap hole is located at a point on the circumference of the circle.

14. The structure of claim 13, wherein the top further comprises second, third, and fourth tap holes connecting the second, third, and fourth feed line, respectively, to the volume enclosed by the process chamber, the second, third, and fourth tap holes being located at points on the circumference of the circle.

15. The structure of claim 8, wherein the feed line is substantially parallel to an interior surface of the top of the process chamber.

16. The structure of claim 15, wherein a portion of the interior surface proximate to the feed line is substantially flat.

17. The structure of claim 8, further comprising a gas outlet nozzle in the tap hole.

* * * * *

UNITED STATES PATENT AND TRADEMARK OFFICE
CERTIFICATE OF CORRECTION

PATENT NO. : 5,421,891
DATED : June 6, 1995
INVENTORS : Gregor A. Campbell, Robert W. Conn, Dan Katz, N. William Parker and David I.C. Pearson It is certified that error appears in the above-identified patent and that said Letters Patent is hereby corrected as shown below:

In Column 9, line 21, delete "E" and insert -- $\underline{E}$ --;

In Column 9, line 21, delete "B" and insert -- $\underline{B}$ --;

In Column 9, line 29, delete "$\nabla^2 B + \alpha^2 \underline{B} = 0$" and insert -- $\nabla^2 \underline{B} + \alpha^2 \underline{B} = 0$ --;

In Column 9, line 33, delete "where i = ($\alpha \, \mu_0$) B" and insert -- where i = ($\alpha/\mu_0$) $\underline{B}$ --;

In Column 9, line 57, delete "$[(\omega/\omega_c) - (\omega_p^2/c^2 k_x^2)]^2$" and insert -- $[(\omega/\omega_c) - (\omega_p^2/c^2 k_z^2)]^2$ --;

In Column 11, line 54, delete "$\alpha$" and insert -- $\lambda$ --;

In Columns 19 and 20 TABLE 1 after line D insert

UNITED STATES PATENT AND TRADEMARK OFFICE
CERTIFICATE OF CORRECTION

PATENT NO. : 5,421,891
DATED : June 6, 1995
INVENTOR(S) : Gregor A. Campbell, Robert W. Conn, Dan Katz, N. William Parker and David I.C. Pearson It is certified that error appears in the above-indentified patent and that said Letters Patent is hereby corrected as shown below:

| E. | Polysilicon Trench Etching | $Cl_2$; $SF_6$; $CF_4$; $Cl_2+O_2$; $SF_6+O_2$; or $CF_4+O_2$; plus He | and/or | $Cl_2$; $SF_6$; $CF_4$; $Cl_2+O_2$; $SF_6+O_2$; $CF_4+O_2$; He |
| --- | --- | --- | --- | --- |
| F. | Planarization of Polysilicon (Blanket Etching) | $Cl_2$; $SF_6$; $CF_4$; $Cl_2+O_2$; $SF_6+O_2$; or $CF_4+O_2$; plus He | and/or | $Cl_2$; $SF_6$; $CF_4$; $Cl_2+O_2$; $SF_6+O_2$; $CF_4+O_2$; He |

Signed and Sealed this

Fourth Day of June, 1996

Attest:

BRUCE LEHMAN

Attesting Officer

Commissioner of Patents and Trademarks